(12) United States Patent  
Zhang et al.

(10) Patent No.: US 11,393,951 B2  
(45) Date of Patent: Jul. 19, 2022

(54) SEMICONDUCTOR STRUCTURE AND METHOD FOR MANUFACTURING THE SAME

(71) Applicant: ENKRIS SEMICONDUCTOR, INC., Suzhou (CN)

(72) Inventors: Liyang Zhang, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 11 days.

(21) Appl. No.: 16/834,677

(22) Filed: Mar. 30, 2020

(65) Prior Publication Data

US 2020/0227592 A1   Jul. 16, 2020

Related U.S. Application Data

(63) Continuation of application No. PCT/CN2018/092886, filed on Jun. 26, 2018.

(51) Int. Cl.  
*H01L 33/24* (2010.01)  
*H01L 33/00* (2010.01)  
(Continued)

(52) U.S. Cl.  
CPC ............ *H01L 33/24* (2013.01); *H01L 33/005* (2013.01); *H01L 33/387* (2013.01); *H01L 33/46* (2013.01); *H01L 33/502* (2013.01)

(58) Field of Classification Search  
CPC ..... H01L 33/24; H01L 33/005; H01L 33/387; H01L 33/46; H01L 33/502; H01L 27/156;  
(Continued)

(56) References Cited

U.S. PATENT DOCUMENTS 9,977,248 B1 * 5/2018 Xie .................. H01L 27/156  
2003/0232455 A1   12/2003 Tanaka  
(Continued)

FOREIGN PATENT DOCUMENTS

| CN | 1489223 A | 4/2004 |
| CN | 103325914 A | 9/2013 |

(Continued)

OTHER PUBLICATIONS

International Search Report in corresponding PCT Application No. PCT/CN2018/092886, dated Mar. 13, 2019.

(Continued)

*Primary Examiner* — Mohammed R Alam  
(74) *Attorney, Agent, or Firm* — Westbridge IP LLC

(57) ABSTRACT

The present application provides a semiconductor structure and a method for manufacturing the same. The semiconductor structure includes: a substrate on which at least one light guide groove is provided, the light guide groove penetrating the substrate; and a light emitting structure disposed on one side of the substrate, the light emitting structure including at least one set of a first electrode and a second electrode. The light guide groove at least corresponds to one set of a first electrode and a second electrode to prevent bad points. A wavelength conversion dielectric layer is filled into the light guide groove to avoid a coffee ring effect and achieve uniform and full-color light emission of a light emitting device. The semiconductor structure may further save manufacturing costs and prevent crosstalk between light emitted from various light emitting units.

17 Claims, 19 Drawing Sheets

(51) Int. Cl.
*H01L 33/38* (2010.01)
*H01L 33/46* (2010.01)
*H01L 33/50* (2010.01)

(58) Field of Classification Search
CPC ....... H01L 33/60; H01L 33/22; H01L 33/382; H01L 33/0093; H01L 33/20
See application file for complete search history.

(56) References Cited

U.S. PATENT DOCUMENTS

| | | | |
|---|---|---|---|
| 2007/0295985 A1 | 12/2007 | Weeks et al. | |
| 2013/0037842 A1* | 2/2013 | Yamada | H01L 33/483 257/98 |
| 2017/0250316 A1* | 8/2017 | Yeon | H01L 25/0753 |
| 2018/0212128 A1* | 7/2018 | Hayashi | H01L 33/507 |

FOREIGN PATENT DOCUMENTS

| | | |
|---|---|---|
| CN | 103390706 A | 11/2013 |
| CN | 103503171 A | 1/2014 |

OTHER PUBLICATIONS

Written Opinion in corresponding PCT Application No. PCT/CN2018/092886, dated Mar. 13, 2019.

\* cited by examiner

SEMICONDUCTOR STRUCTURE AND METHOD FOR MANUFACTURING THE SAME

CROSS-REFERENCE TO RELATED APPLICATIONS

The present application is a continuation of International Application No. PCT/CN2018/092886 filed on Jun. 26, 2018, all contents of which are incorporated herein by reference in its entirety.

TECHNICAL FIELD

The present application relates to the field of semiconductors, in particular to a semiconductor structure and a method for manufacturing the same.

BACKGROUND

Micro-LED (Micro Light Emitting Diode) technology is also called LED micro display technology. Compared with traditional LED display technology, the LED micro display technology has a simple design, which may reduce the overall system volume and weight, and has a large space for reducing manufacturing costs. At the same time, it takes into account the advantages of low power consumption, high light energy utilization, fast response speed, wide operating temperature range, and strong anti-interference ability.

However, there are still some technical difficulties in the current LED micro display technology. For example, for LED micro display, in order to improve the pixel, the distance between core particles is small, and the angle of the emitted light is large, which is easy to cause the crosstalk of the emitted light between the core particles. In addition, the manufacturing costs and various performances (light directionality, uniformity, etc.) of the LED micro display technology also need to be further improved.

SUMMARY

In view of this, an embodiment of the present application provides a semiconductor structure, including: a substrate on which at least one light guide groove is provided, the light guide groove penetrating the substrate; and a light emitting structure disposed on one side of the substrate, the light emitting structure including at least one light emitting unit. The light guide groove at least corresponds to one light emitting unit.

Further, a shape of the light guide groove may be one of a circle, a square, a hexagon, and a triangle when viewed from a plan view of one side of the substrate away from the light emitting structure, which is not specifically limited herein.

Further, a wavelength conversion dielectric material may be disposed in the light guide groove, and the wavelength conversion dielectric material may include quantum dots, phosphors, and the like.

Further, a reflective layer may be further provided on a side wall of the light guide groove.

Further, the semiconductor structure may further include other semiconductor layers provided between the substrate and a first semiconductor layer, and the semiconductor layers include a nucleation layer, a buffer layer, and the like.

Further, the light emitting structure includes: the first semiconductor layer, an active layer, a second semiconductor layer, at least one first electrode, and at least one second electrode.

Specifically, the first semiconductor layer is disposed on one side of the substrate; the active layer is disposed on one side of the first semiconductor layer away from the substrate; the second semiconductor layer is disposed on one side of the active layer away from the first semiconductor layer; the first electrode sequentially penetrates the second semiconductor layer and the active layer from one side of the second semiconductor layer away from the active layer and extends to the first semiconductor layer, and the first electrode is connected to the first semiconductor layer, and is insulated and blocked from the second semiconductor layer and the active layer; and the second electrode is disposed on the one side of the second semiconductor layer away from the active layer.

Further, the light emitting structure may further include: at least one filling groove penetrating from one side of the second semiconductor layer away from the substrate to the first semiconductor layer, the filling groove partially penetrating the first semiconductor layer, and the first electrode being located in the filling groove and being connected to the first semiconductor layer; and an insulating material provided between a side wall of the filling groove and the first electrode to achieve the insulation and blocking between the first electrode and the second semiconductor layer, and the active layer.

Further, at least one ion implanted layer penetrating from one side of the second semiconductor layer away from the active layer to the first semiconductor layer may be provided. The ion implanted layer at least partially penetrates the second semiconductor layer, so that the light emitting structure is divided into a plurality of independent light emitting units, and the ions include H, F, and the like.

Further, the ion implanted layer may be replaced by a groove, and the groove at least partially penetrates the second semiconductor layer to isolate a light emitting unit from a light emitting unit. Further, an insulating layer may be disposed on a bottom and a side wall of the groove; further, the groove may be filled with the insulating layer fully.

In another aspect, an embodiment of the present application further provides a method for manufacturing a semiconductor structure, the method includes: providing a substrate; forming a light emitting structure on one side of the substrate, the light emitting structure including at least one light emitting unit; and etching the substrate to form at least one light guide groove on the substrate, the light guide groove penetrating the substrate. The light guide groove at least corresponds to one light emitting unit.

Further, the method for manufacturing a semiconductor structure may further include: forming a wavelength conversion dielectric layer, such as a quantum dot layer and a phosphor layer, in the light guide groove.

Further, the method for manufacturing a semiconductor structure may further include: forming a reflective layer on a side wall of the light guide groove.

Further, the method for manufacturing a semiconductor structure further includes a method for forming the light emitting structure, which includes: sequentially growing a first semiconductor layer, an active layer, and a second semiconductor layer on one side of the substrate; forming at least one filling groove on one side of the second semiconductor layer away from the substrate, the filling groove completely penetrating the second semiconductor layer, the active layer, and partially penetrating the first semiconductor layer; preparing a first electrode in the filling groove, the first electrode being insulated and blocked from the second semiconductor layer and the active layer, and being connected to the first semiconductor layer; and preparing a second electrode on one side of the second semiconductor layer away from the active layer.

Further, the method for manufacturing a semiconductor structure may further include: growing other semiconductor layers between the substrate and the first semiconductor layer, and the semiconductor layers include a nucleation layer, a buffer layer, and the like.

Further, the steps of preparing the first electrode and the second electrode in the filling groove include: depositing an insulating material from one side of the second semiconductor layer away from the active layer, the insulating material being deposited on the first semiconductor layer, and on a bottom and a side wall of the filling groove; etching the insulating material in the filling groove to form an accommodating space for accommodating a first electrode material; etching the insulating material on one side of the second semiconductor layer away from the active layer to form an accommodating space for accommodating a second electrode material; filling an electrode material in the accommodating space of the first electrode material to form the first electrode, the first electrode being connected to the first semiconductor layer, and being insulated and blocked from the second semiconductor layer and the active layer through the insulating material remaining in the filling groove; filling an electrode material in the accommodating space of the second electrode material to form the second electrode; and depositing the insulating material continuously on one side of the second semiconductor layer away from the active layer to form an insulating layer between the first electrode and the second electrode.

Further, the method for manufacturing a semiconductor structure further includes providing an insulating structure on the light emitting structure. The providing an insulating structure includes: implanting ions, etching a groove, etc., which divides the light emitting structure into the light emitting units that are insulated from each other.

When an ion implanted layer is used as the insulating structure, a preparing step of the ion implanted layer includes: forming at least one ion implanted layer on one side of the second semiconductor layer away from the active layer. The ion implanted layer at least partially penetrates the second semiconductor layer, and the implanted ions include H, F and the like.

When an groove is used as the insulating structure, preparing steps of the groove include: forming at least one groove on one side of the second semiconductor layer away from the active layer, the groove at least partially penetrating the second semiconductor layer; and filling at least one of a temporary dielectric layer and an insulating material in the groove where an insulating layer is deposited on a bottom and a side wall.

The present application proposes a semiconductor structure and a method for manufacturing the same. The involved semiconductor structure adopts a thin film flip-chip process, without stripping a substrate. A light guide groove is formed by etching the substrate to make each light emitting unit emit light uniformly, with good directivity and high light extraction rate, which avoids crosstalk of emitted light between a light emitting unit and a light emitting unit. A light guide groove corresponding to at least one light emitting unit is formed to prevent defective core particles. A wavelength conversion dielectric is directly coated on the remaining substrate to avoid a coffee ring effect and achieve full-color display with high resolution and cost saving. In addition, the semiconductor structure solves the problem of a common cathode, so that the current distribution between different pixels is uniform.

In order to make the above and other objects, features, and advantages of the present application more comprehensible, the preferred embodiments are described below in detail with reference to the accompanying drawings.

BRIEF DESCRIPTION OF DRAWINGS

In order to more clearly explain the embodiments of the present application or the technical solutions in the prior art, the accompanying drawings used in the embodiments will be briefly introduced below. Obviously, the accompanying drawings in the following description are just some embodiments of the present application. For a person of ordinary skill in the art, other accompanying drawings may be obtained based on these accompanying drawings without paying creative labor. The above and other objects, features, and advantages of the present application will be clearer through the accompanying drawings. The same reference numerals indicate the same parts throughout the accompanying drawings. The accompanying drawings are not deliberately drawn to scale according to the actual size, with an emphasis on illustrating the gist of the present application.

FIG. 10 is a schematic cross-sectional view illustrating a semiconductor structure in which a light guide groove corresponds to a plurality of light emitting units according to an embodiment of the present application.

Figure 1:
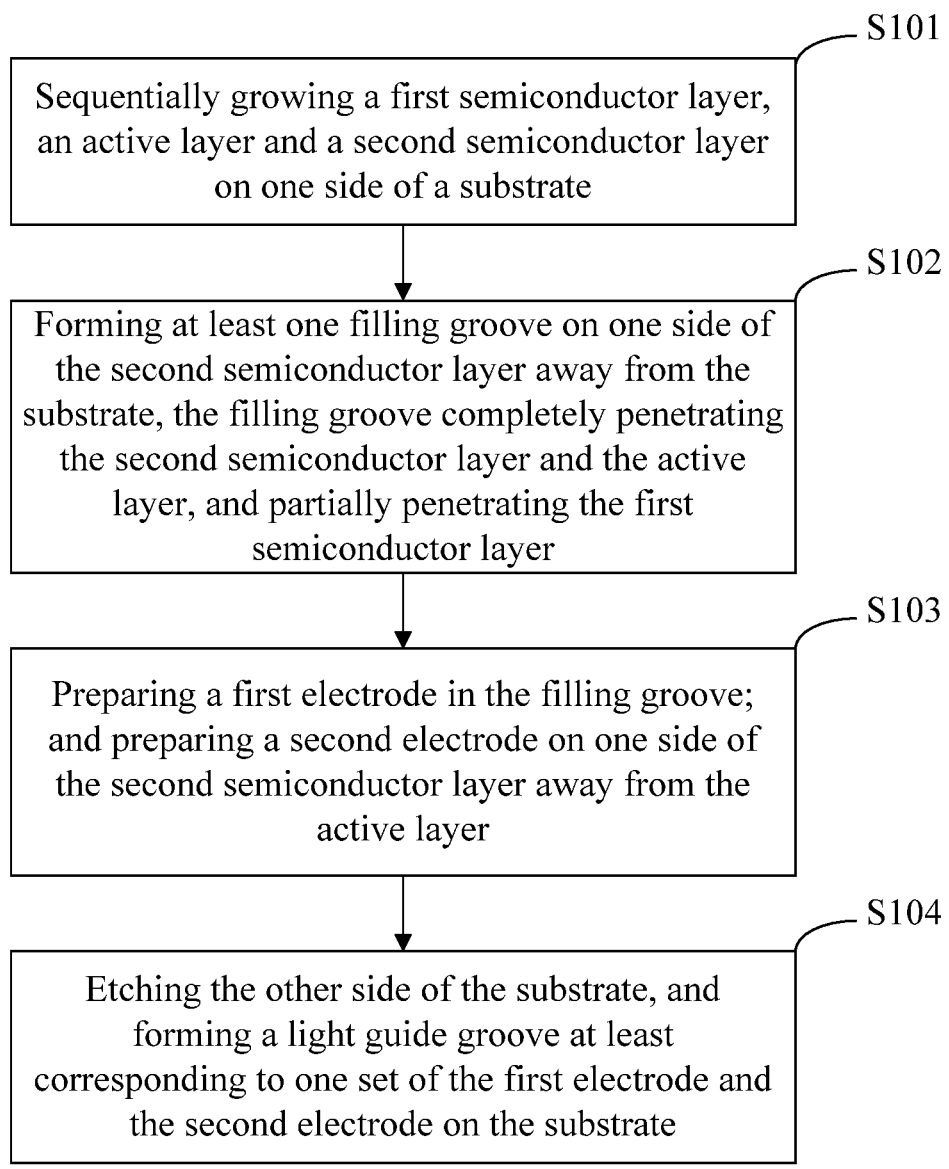
FIG. 1 is a schematic flowchart illustrating a method for manufacturing a semiconductor structure according to an embodiment of the present application.

Icons: 100—substrate; 101—light guide groove; 200—light emitting structure; 2001—light emitting unit; 201— first semiconductor layer; 202—active layer; 203—second semiconductor layer; 204—groove; 205—first electrode; 2051—filling groove; 206—second electrode; 207—insulating material; 208—photoresist; 209—ion implanted layer; 210—buffer layer; 102—quantum dot layer; 103—reflective layer; 104—roughening/patterning; 300—driving circuit; 301—conductive structure; 302—electrode bonding pad.

DETAILED DESCRIPTION OF THE EMBODIMENTS

The technical solutions in the embodiments of the present application will be clearly and completely described below in detail with reference to the accompanying drawings in the embodiments of the present application. Obviously, the described embodiments are only a part of the embodiments of the present application, but not all of the embodiments. Based on the embodiments of the present application, all other embodiments obtained by a person of ordinary skill in the art without creative efforts shall fall within the protection scope of the present application.

It should be noted that similar reference numerals and letters indicate similar items in the following accompanying drawings, so once an item is defined in one accompanying drawing, it need not be further defined and explained in subsequent accompanying drawings. Meanwhile, in the description of the present application, the terms "first", "second", and the like are only used to distinguish descriptions, and cannot be understood to indicate or imply relative importance. In the description of the embodiments of the present application, it may be understood that when a layer (or film), region, pattern, or structure is referred to as being "above" or "below" another substrate, another layer (or film), another region, another pad, or another pattern, it can be "directly" or "indirectly" on another substrate, layer (or film), region, pad, or pattern, or one or more intermediate layers may also be present. These positions of the layers have been described with reference to the accompanying drawings. For convenience or clarity, the thickness and size of each layer shown in the accompanying drawings may be exaggerated, omitted, or drawn schematically. In addition, the dimensions of the components do not fully reflect the actual dimensions.

FIG. 1 to FIG. 12 illustrate a process flow of a method for manufacturing a semiconductor structure according to a preferred embodiment of the present application. The processes are described in detail below with reference to the accompanying drawings. It should be noted that the method according to the present application is not limited by FIG. 1 and the specific order described below. It should be understood that in other embodiments, the order of some steps in the method according to the present application may be exchanged with each other according to actual needs, or some of the steps may be omitted or deleted.

Figure 2A:
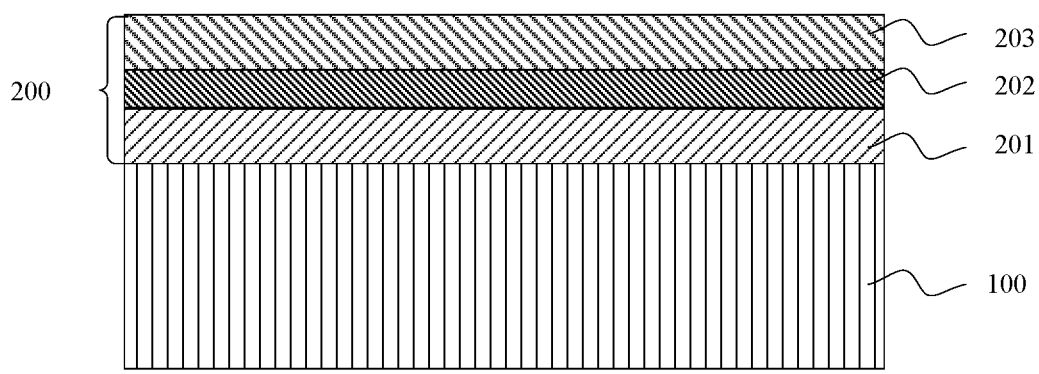
FIG. 2 to FIG. 12 are schematic structural diagrams illustrating a semiconductor structure corresponding to each process step in a method for manufacturing the semiconductor structure according to an embodiment of the present application.

As shown in FIG. 1, a method for manufacturing a semiconductor structure includes the following steps:

Step S101: providing a substrate, and forming a light emitting structure on one side of the substrate. As shown in FIG. 2a, the light emitting structure includes: a first semiconductor layer 201, an active layer 202, and a second semiconductor layer 203. Specifically, the first semiconductor layer 201, the active layer 202 and the second semiconductor layer 203 are sequentially grown on the substrate 100.

In this embodiment, the first semiconductor layer 201 may have N-type conductivity, and the second semiconductor layer 203 may have P-type conductivity. In other embodiments of the present application, the first semiconductor layer 201 may have P-type conductivity, and the second semiconductor layer 203 may have N-type conductivity.

The light emitting structure emits light by the combination of electrons and holes injected by the first semiconductor layer 201 and the second semiconductor layer 203 in the active layer 202, and the emitted light is emitted through the first semiconductor layer 201.

The active layer 202 is disposed between the first semiconductor layer 201 and the second semiconductor layer 203. The active layer 202 may have a structure such as a multiple quantum well. The multiple quantum well structure includes a plurality of quantum well layers and a plurality of barrier layers formed between the quantum well layers. The quantum well layer and the quantum barrier layer may be optimally composed of a GaN-based material. The GaN-based material includes at least Ga and N atoms, such as GaN, AlGaN, AlInGaN, etc., but needs to satisfy the requirement that the energy band of the quantum barrier layer is wider than that of the quantum well layer. Specifically, if the semiconductor structure is a GaN-based light emitting device, the first semiconductor layer 201 may be composed of a GaN-based material doped with an n-type impurity, the second semiconductor layer 203 may be composed of a GaN-based material doped with a p-type impurity, and the active layer 202 may be formed by alternately stacking a quantum well layer formed of $Al_XIn_YGa_{1-X-Y}N$ (0<X<1, 0<Y<1, 0<X+Y<1) and a quantum barrier layer formed of AlInGaN having a wider energy band.

Figure 2B:
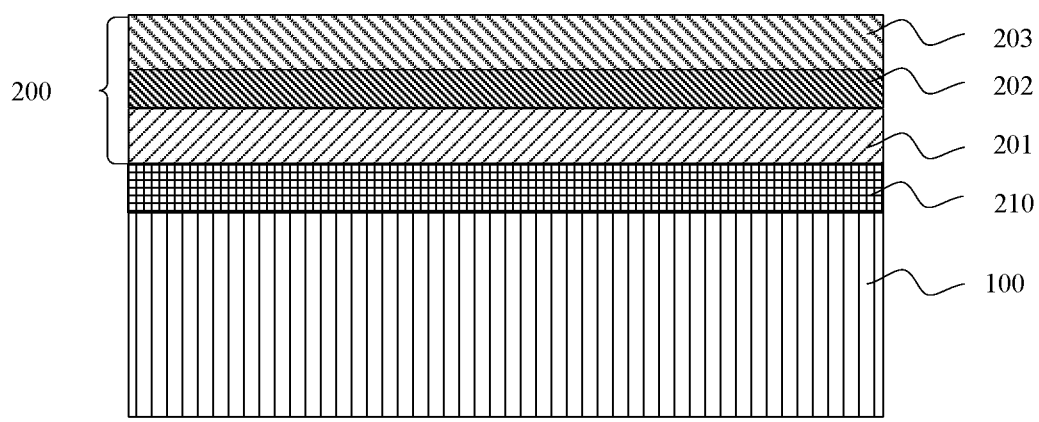

In other embodiments of the present application, other semiconductor layers may be designed between the substrate 100 and the first semiconductor layer 201 according to technical requirements. As shown in FIG. 2b, a buffer layer 210 is first grown between the substrate 100 and the first semiconductor layer 201, which is used to perform stress control on the semiconductor structure grown on the buffer layer 210, so as to avoid the cracking of the semiconductor structure caused by the accumulation of stress. Of course, the arrangement of the semiconductor layers between the first semiconductor layer 201 and the substrate 100 is not specifically defined in the present application, which may be determined according to the materials and technical requirements of the substrate and the first semiconductor layer.

Figure 3A:
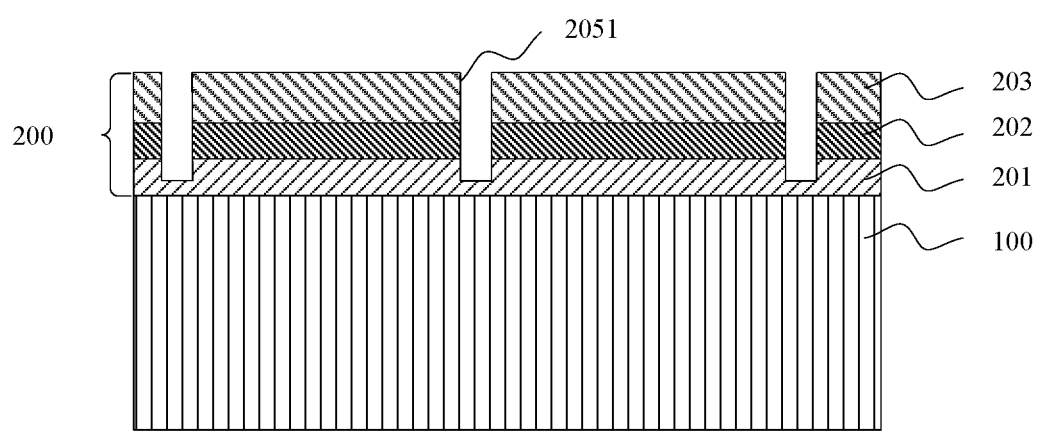

Further, the light emitting structure 200 further includes: at least one set of a first electrode 205 and a second electrode 206, specifically:

Step S102: as shown in FIG. 3a, forming at least one filling groove 2051 on one side of the second semiconductor layer 203 away from the substrate 100, the filling groove 2051 completely penetrating the second semiconductor layer 203 and the active layer 202, and partially penetrating the first semiconductor layer 201.

Step S103: preparing a first electrode 205 in the filling groove 2051, the first electrode 205 being insulated and blocked from the second semiconductor layer 203 and the active layer 202, and being connected to the first semiconductor layer 201; and preparing a second electrode 206 on one side of the second semiconductor layer 203 away from the active layer 202.

In this embodiment, the filling groove 2051 may be formed by an etching method. The filling groove 2051 penetrates the second semiconductor layer 203, the active layer 202 sequentially, and extends to the first semiconductor layer 201, but does not penetrate the first semiconductor layer 201.

Figure 4:
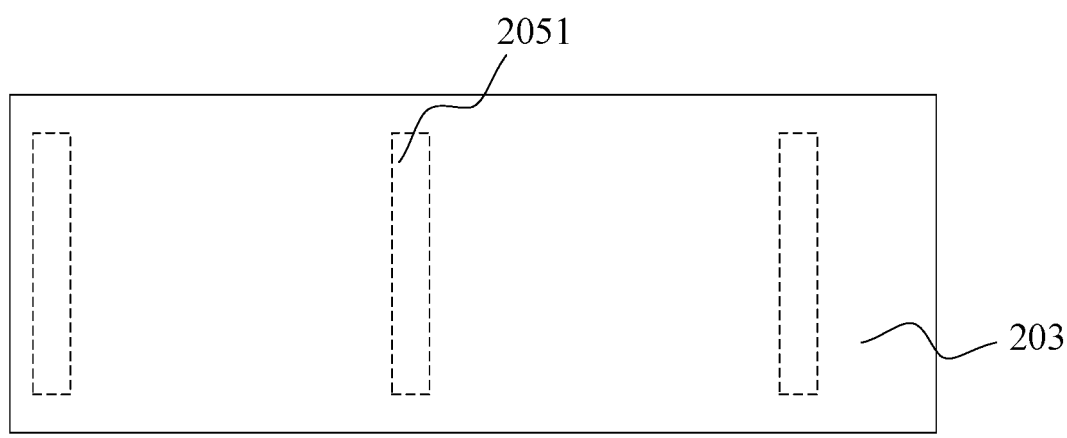

In detail, as shown in FIG. 4, FIG. 4 shows a top view of the semiconductor structure after forming the filling groove 2051 viewed from one side of the second semiconductor layer 203 away from the substrate 100, and the filling groove 2051 may extend a certain distance in the plane.

Figure 2C:
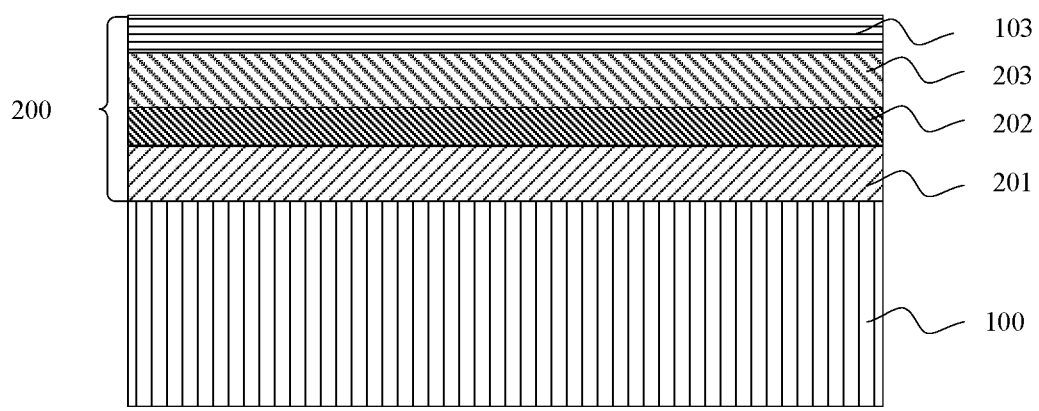
Figure 3B:
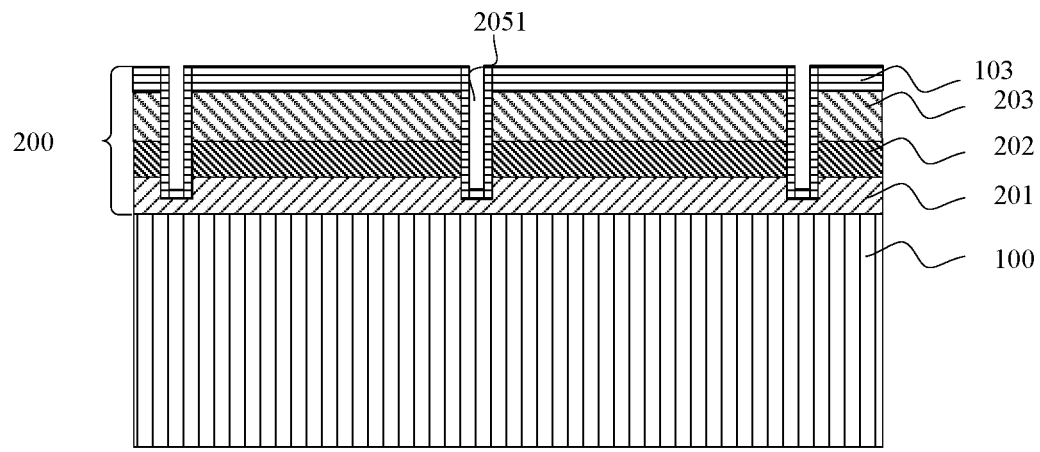

In other embodiments, the light emitting structure 200 further includes: a reflective layer 103 used to improve the light emitting efficiency of a semiconductor device. Specifically: one reflective layer 103 may be grown on one side of the second semiconductor layer 203 away from the active layer 202, as shown in FIG. 2c. It may be understood that after the filling groove 2051 is etched, the reflective layer 103 may be deposited in the filling groove 2051, as shown in FIG. 3b.

Figure 5:
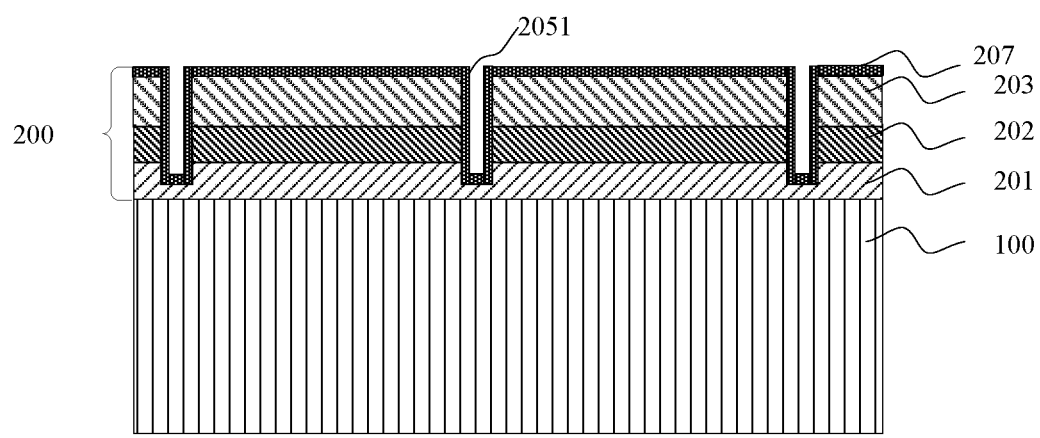

In this embodiment, step S103 may specifically include the following sub-steps:

Sub-step a: as shown in FIG. 5, depositing an insulating material on one side of the second semiconductor layer 203 away from the active layer 202 to form an insulating layer 207 deposited on the first semiconductor layer 201, and a bottom and a side wall of the filling groove 2051.

Figure 6:
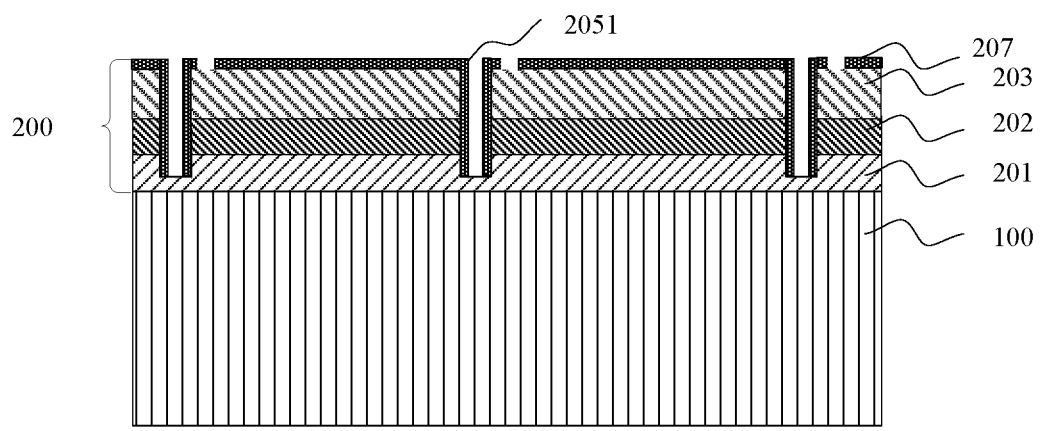

Sub-step b: as shown in FIG. 6, etching the insulating material 207 at the bottom of the filling groove 2051 to form an accommodating space for accommodating a material of the first electrode 205; and etching the insulating material 207 on one side of the second semiconductor layer 203 away from the active layer 202 to form an accommodating space for accommodating a material of the second electrode 206.

Figure 7:
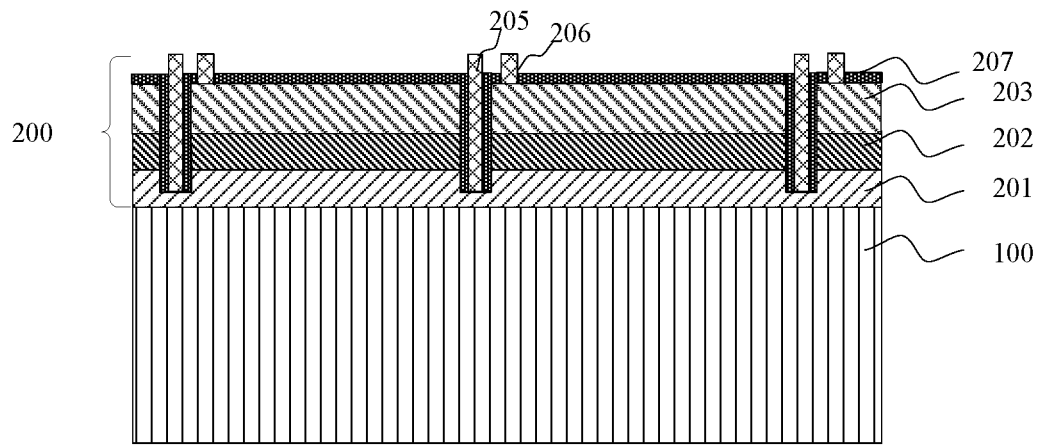

Sub-step c: as shown in FIG. 7, filling an electrode material in the accommodating space of the first electrode material to form the first electrode 205, the first electrode being connected to the first semiconductor layer 201 and being insulated and blocked from the second semiconductor layer 203 and the active layer 202; and filling an electrode material in the accommodating space of the second electrode material to form the second electrode 206.

Figure 8:
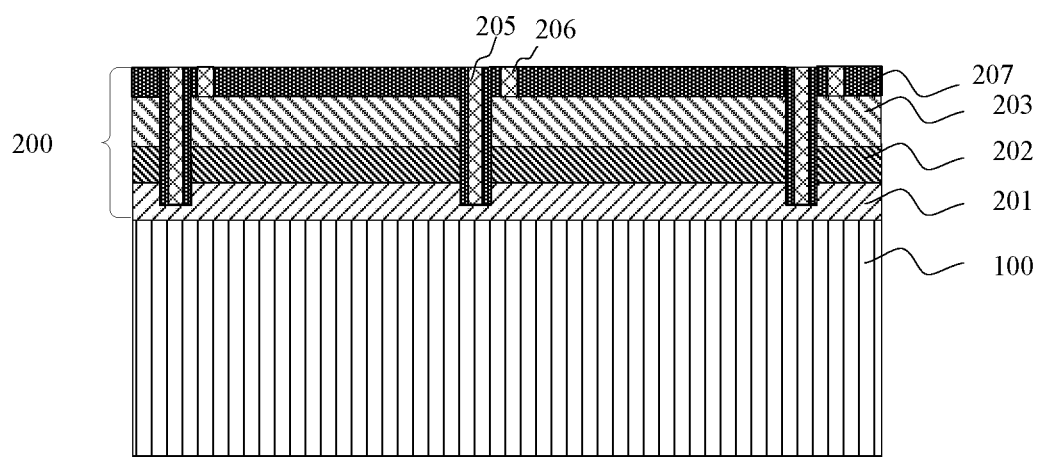

Sub-step d: as shown in FIG. 8, depositing the insulating material continuously on one side of the second semiconductor layer 203 away from the active layer 202 to insulate the first electrode 205 and the second electrode 206.

In this embodiment, the insulating material 207 is provided between the first electrode 205 and the side wall of the filling groove 2051, so as to achieve the insulation and blocking between the first electrode 205 and the second semiconductor layer 203, and the active layer 202, and connect the first electrode 205 to the first semiconductor layer 201.

In this embodiment, the insulating material 207 may be silicon dioxide, silicon nitride, or the like, but it is not limited thereto, and may also be any other suitable insulating material. Specifically, the insulating material 207 that may function as the electrical interruption may be directly formed in the filling groove 2051 by a chemical vapor deposition method or the like, and the necessary electrical interruption does not need to be achieved through processes such as filling, etching, and the like.

Further, the electrode materials used to make the first electrode 205 and the second electrode 206 may be a metal or a multilayer metal such as gold, copper, silver, zinc, platinum, tantalum, titanium, aluminum, tungsten, nickel, etc., which are not limited in the embodiments of the present application.

Figure 9A:
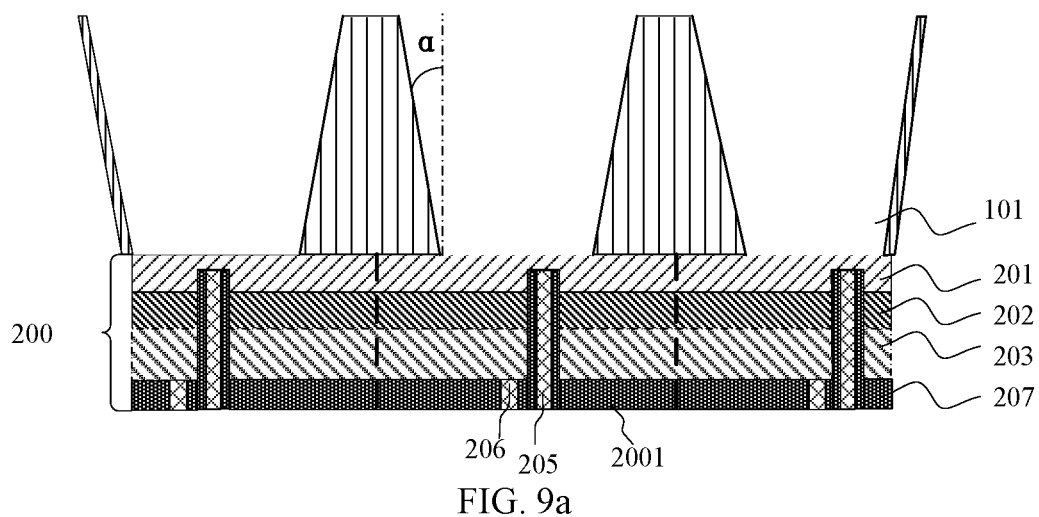
Figure 9B:
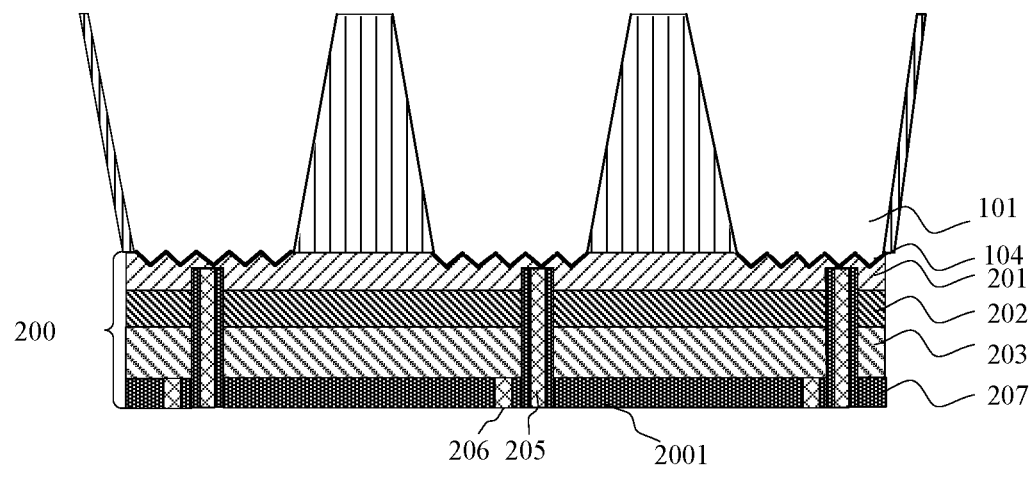

Step S104: as shown in FIG. 9a, etching the substrate 100, and forming a light guide groove 101 at least corresponding to one light emitting unit 2001 on the other side of the substrate. The light guide groove 101 completely penetrates the substrate. As shown in FIG. 9a, the light emitting structure 200 is divided into three light emitting units 2001 by dotted lines. Each light emitting unit 2001 includes the first semiconductor layer 201, the active layer 202, and the second semiconductor layer 203, and includes only one set of the first electrode and the second electrode. Those skilled in the art should know that the dotted lines here are not strictly at the positions shown in FIG. 9a to distinguish the light emitting units, and the positions of the dotted lines may be flexibly changed, as long as only one set of electrodes is guaranteed for one light emitting unit. The semiconductor structure shown in FIG. 9a is a schematic view after the substrate 100 is etched and the entire semiconductor structure is turned over. The light emitting structure 200 shown in FIG. 9a includes three light emitting units 2001.

Figure 10:
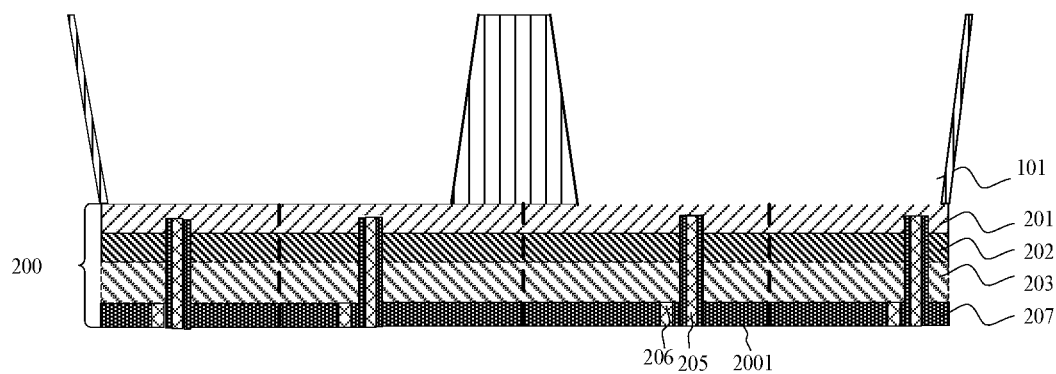

In this embodiment, the light guide groove 101 corresponds to one light emitting unit 2001, i.e., referring to FIG. 9a. In other embodiments, the light guide groove 101 may correspond to a plurality of light emitting units 2001. As shown in FIG. 10, the light guide groove 101 corresponds to two light emitting units 2001. When one light emitting unit is disconnected, the other light emitting units may still emit light normally, which avoids the "bad point" problem commonly seen in the display field. The number of the light emitting units 2001 corresponding to the light guide groove 101 is not particularly limited here, as long as at least one light emitting unit corresponds to the light guide groove 101. The number of the light emitting units 2001 corresponding to the light guide groove 101 may be selected according to the specific device application requirements.

In this embodiment, the substrate 100 is made of silicon, silicon carbide, sapphire, or the like, but is not limited thereto. It is preferable that using the silicon as the substrate 100 is relatively easy to etch, the light emitting structure is epitaxially grown on the silicon substrate, and the uniformity of the emission wavelength is also good. Preferably, in step S104, the substrate 100 may be thinned before being etched.

It may be understood that after the substrate is etched to form the light guide groove 101, a first semiconductor layer 201 in the semiconductor structure may be partially exposed (shown in FIG. 9a). Preferably, after the roughening or patterning 104 is performed on the exposed part of the first semiconductor layer 201 (shown in FIG. 9b), a quantum dot or phosphor layer 102 (shown in FIG. 11b) is deposited in the light guide groove 101, so that the semiconductor structure is fully colored, and the light extraction rate of the semiconductor structure is further improved. The method and shape of the roughening or patterning described in the embodiments are not specifically limited in this case.

Figure 11A:
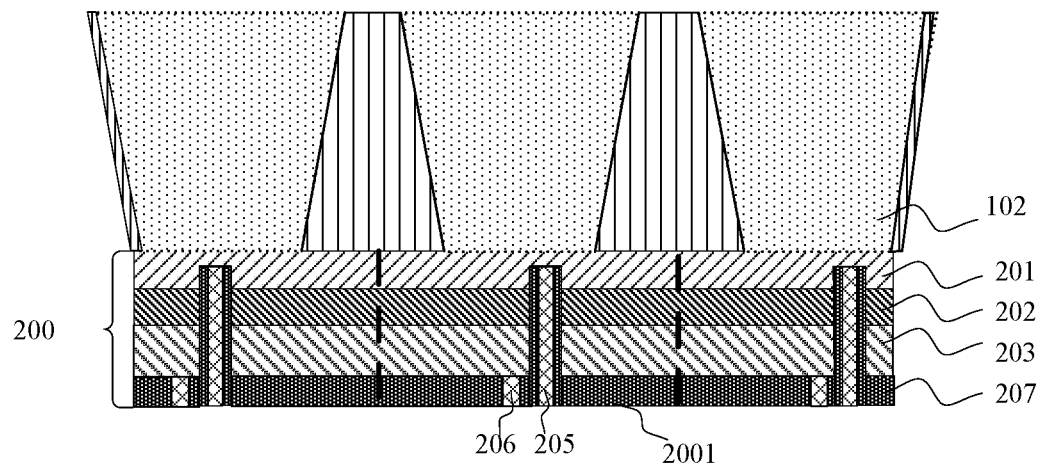
Figure 11B:
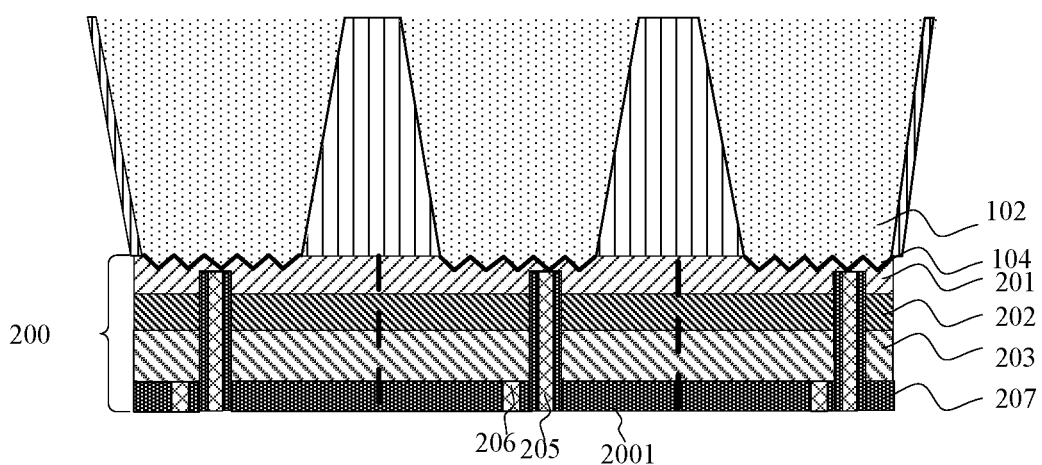

Further, the method for manufacturing a semiconductor structure further includes: forming a wavelength conversion dielectric layer, such as a quantum dot layer and a phosphor layer, in the light guide groove 101. As shown in FIG. 11a, the quantum dot layer 102 is formed in the light guide groove, the remaining substrate after etching the light guide groove is used as a mask, and quantum dots are directly deposited on the mask by spraying to form the quantum dot layer 102, so as to avoid the coffee ring effect, thereby enabling the semiconductor structure to achieve the full-color display.

Figure 24A:
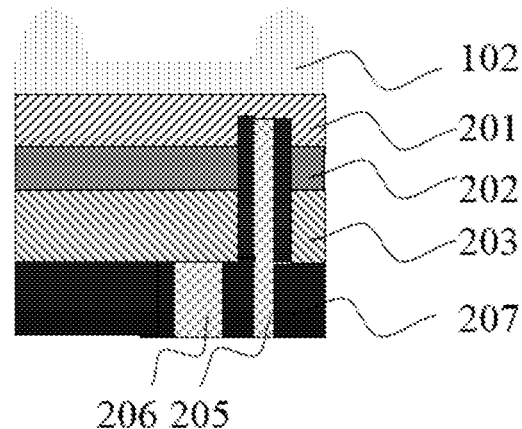
FIG. 24a and FIG. 24b are schematic diagrams illustrating a comparison of the distribution of quantum dots sprayed on a conventional semiconductor structure and a semiconductor structure according to an embodiment of the present application.
Figure 24B:
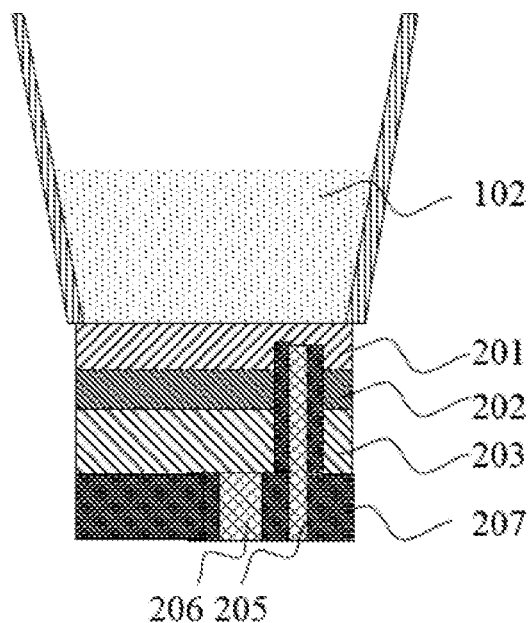

The coffee ring effect refers to a phenomenon that when a drop of coffee is dropped on the table, the particulate matter of the coffee droplet may leave a dyed ring on the table, the color of the ring is uneven, and the edge part of the ring is darker than the middle. The main reason is that coffee droplets keep their edges unchanged during the evaporation process, and the evaporation speed of the edges of the coffee droplets is relatively fast. In order to supplement the liquid evaporated from the edges, a directional flow from the center of the coffee droplets to the edges is formed. This capillary flow carries almost all of the suspended particles to the edges of the coffee droplets, and eventually accumulates to form the coffee ring. In the conventional technologies, when quantum dots and phosphors are directly applied on a plane, the situation shown in FIG. 24a unavoidably occurs. In this embodiment, the remaining substrate after etching the light guide groove may avoid the coffee ring effect, as shown in FIG. 24b.

Figure 12:
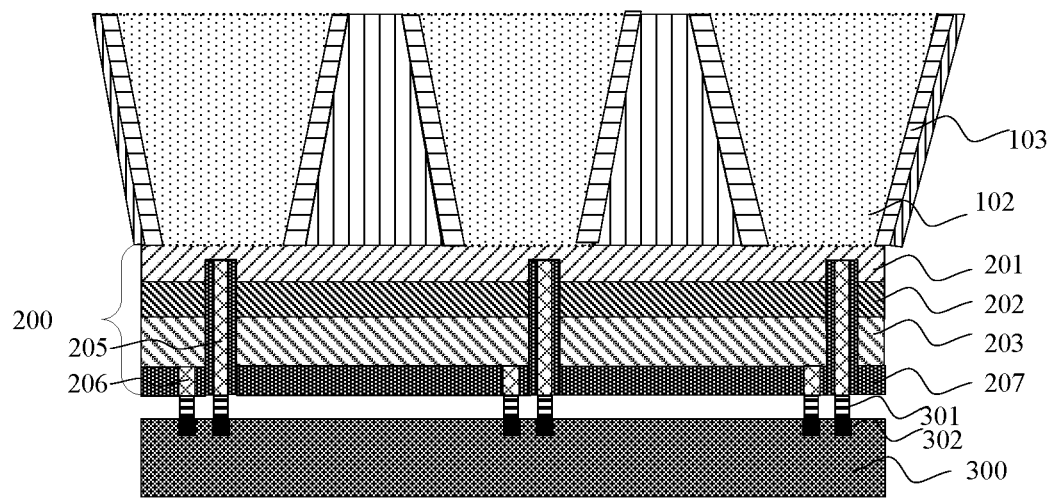

Further, the method for manufacturing a semiconductor structure further includes: forming a reflective layer 103 on a side wall of the light guide groove 101 in advance, which is more beneficial to light emission of a light emitting device, as shown in FIG. 12.

Figure 13:
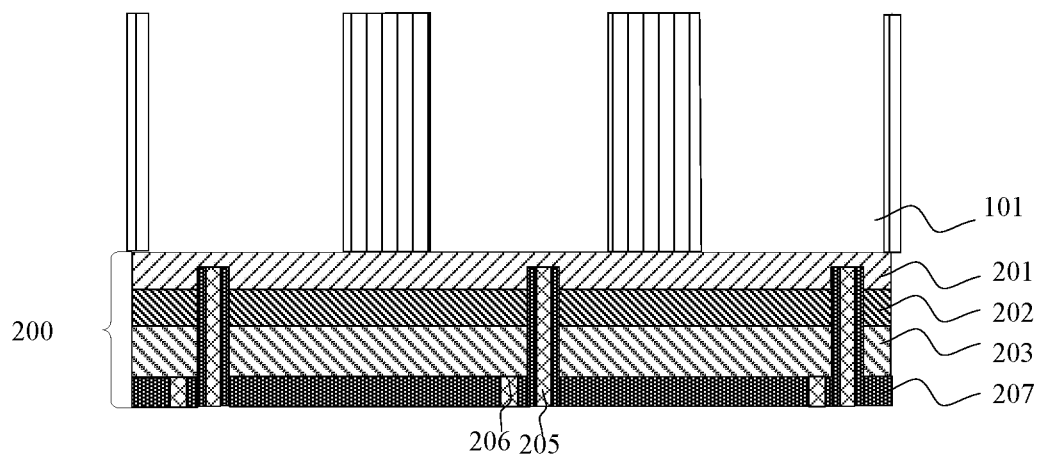
FIG. 13 to FIG. 15 are schematic cross-sectional views illustrating a semiconductor structure according to another embodiment of the present application.
Figure 14:
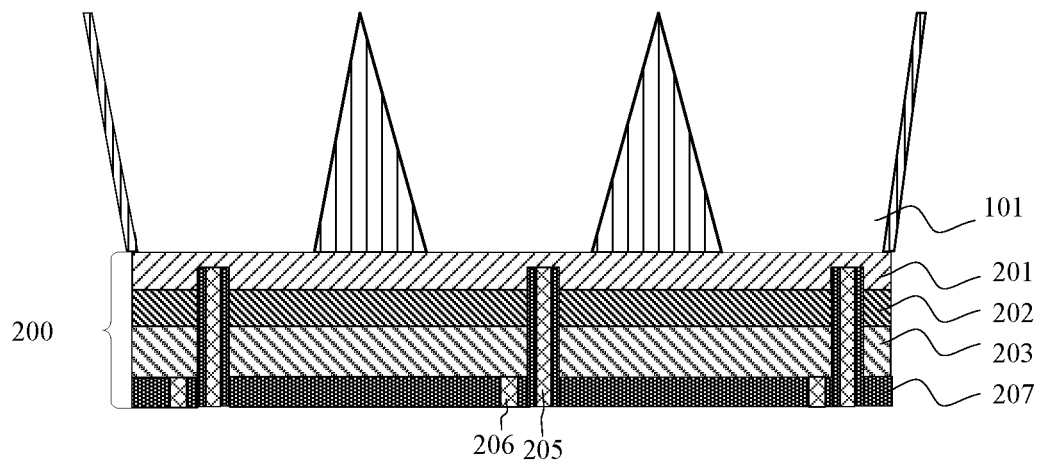
Figure 15:
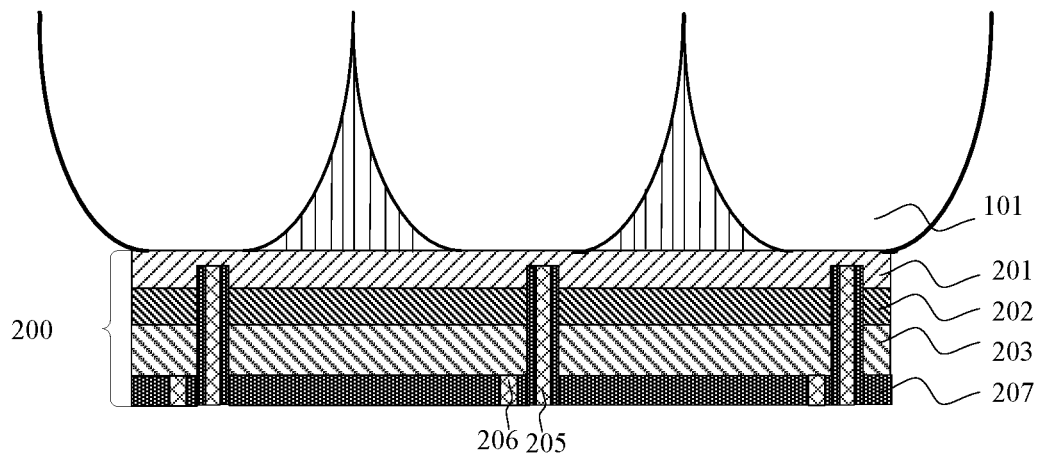

Further, the light guide groove 101 may have a trapezoidal shape, a rectangular shape, a semicircular shape, or the like when viewed in cross section. Taking the semiconductor structure shown in FIG. 9a as an example, the light guide groove 101 is a trapezoidal structure when viewed in cross section. The angle between one side of the light guide groove 101 and the vertical direction is α, the range of α is from 0° to 80°, and a preferred angle range is from 10° to 60°. When α=0°, the cross section of the light guide groove 101 is a rectangular structure, as shown in FIG. 13. In other embodiments, the cross section of the light guide groove is still a trapezoidal structure, but the distance between the sides of the adjacent light guide grooves away from the first semiconductor layer is infinitely close to 0, so that the cross section of the remaining substrate portion forms a triangular structure, as shown in FIG. 14. In addition, according to the adjustment of the growth conditions, in other embodiments, the cross section of the light guide groove 101 may not be a conventional pattern, as shown in FIG. 15. Therefore, the shape of the light guide groove 101 is not specifically limited in the present application.

Figure 16:
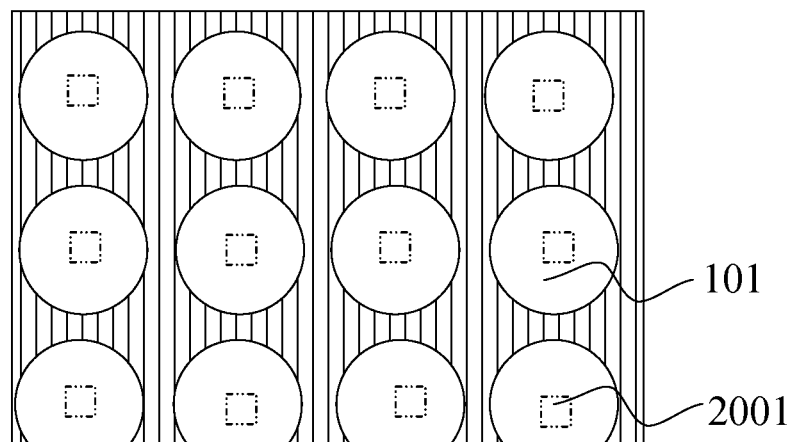
FIG. 16 to FIG. 19 are schematic plan views illustrating light guide grooves according to an embodiment of the present application, which are shown in a partial cross-sectional view of a top view viewed from one side of a substrate away from a first semiconductor layer.
Figure 17:
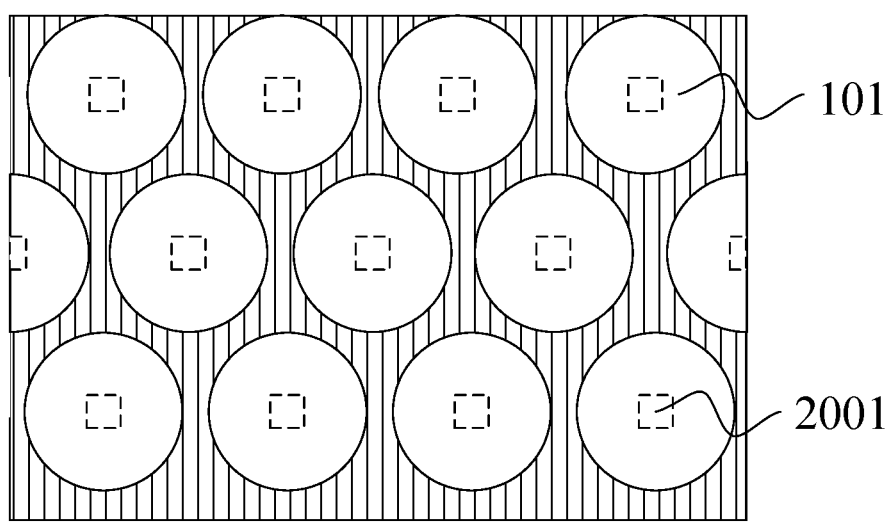
Figure 18:
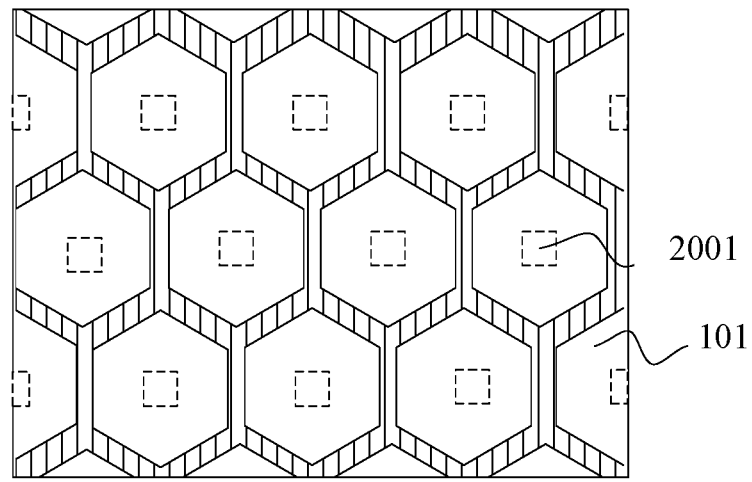
Figure 19:
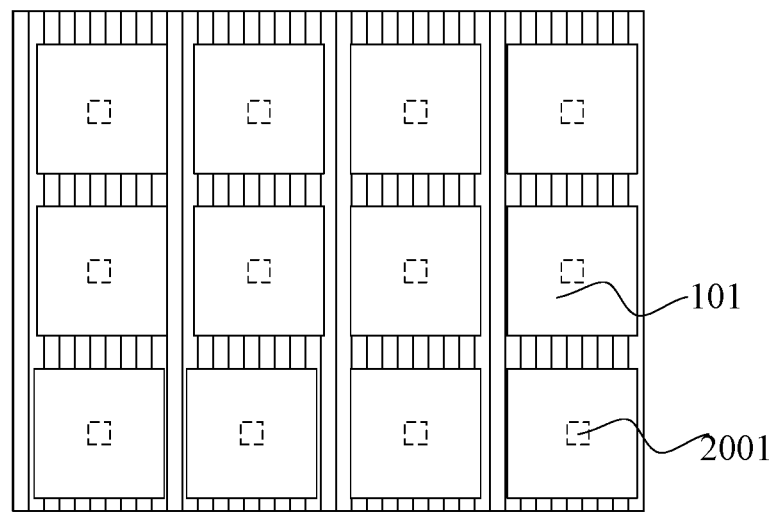

Further, as shown in FIG. 16 to FIG. 19, partial screenshots of a top view of the light guide groove 101 viewed from one side of the substrate away from the light emitting structure 200 after the formation of the light guide groove 101 are shown. Within the dotted lines is a single light emitting unit 2001, and in the plane, the light guide groove 101 may be circular, as shown in FIG. 16 and FIG. 17, may be hexagonal, as shown in FIG. 18, and may be quadrilateral, as shown in FIG. 19. In order to increase the light emitting area of the light emitting device, the embodiments shown in FIG. 17 to FIG. 19 are preferred.

Figure 20A:
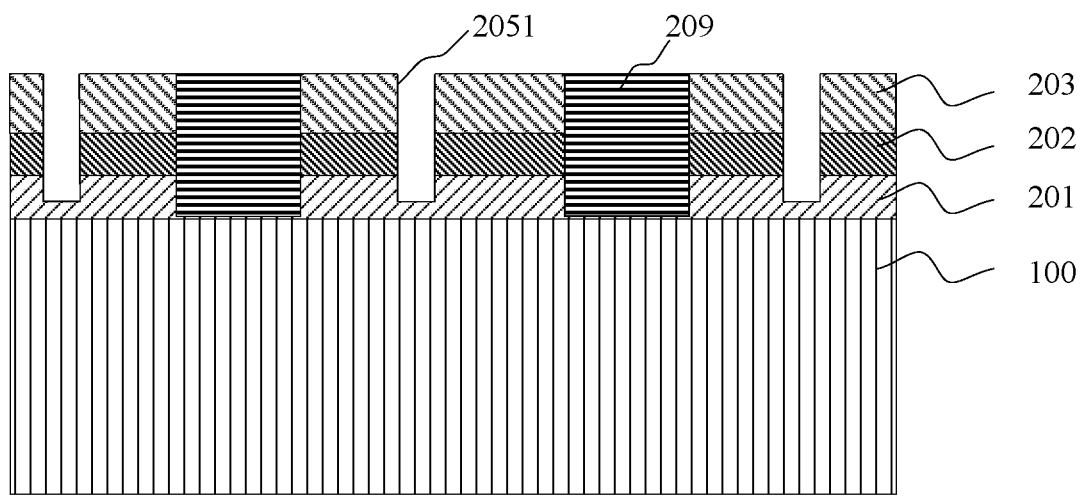
FIG. 20a to FIG. 20j are schematic cross-sectional views illustrating a semiconductor structure in which light emitting units are isolated by an ion implanted layer according to an embodiment of the present application.

Further, the method for manufacturing a semiconductor structure further includes providing an insulating structure on the light emitting structure to isolate a light emitting unit from a light emitting unit. The insulating structure may be an ion implanted layer, an etching groove, or the like. When the pixel requirement is high, the distance between the light emitting unit and the light emitting unit is relatively short, and there may be the problem of crosstalk of the light between two adjacent light emitting units. The insulating structure is further used to prevent the crosstalk of the light. Preferably, selecting the ion implanted layer as the insulating structure may avoid defects introduced by the etched edges and ensure the quality of the semiconductor structure. Specifically:

when the insulating structure between the light emitting unit and the light emitting unit is an ion implanted layer 209, as shown in FIG. 20a to FIG. 20j, at least one ion implanted layer 209 implanted from one side of the second semiconductor layer away from the active layer may be provided before the first electrode 205 and the second electrode 206 are formed. As shown in FIG. 20a, the ion implanted layer 209 at least partially penetrates the second semiconductor layer 203. The light emitting structure 200 is divided into a plurality of independent light emitting units 2001 by the ion implanted layer 209, and the implanted ions include H, F, and the like. FIG. 20b to FIG. 20j are schematic diagrams after the semiconductor structure having the ion implanted layer 209 according to this embodiment is inverted.

Specifically, the step of providing the ion implanted layer 209 in the light emitting structure includes: sequentially growing the first semiconductor layer 201, the active layer 202, and the second semiconductor layer 203 on one side of the substrate 100; forming the at least one ion implanted layer 209 on one side of the second semiconductor layer 203 away from the active layer 202, the ion implanted layer 209 at least partially penetrating the second semiconductor layer 203 to insulate the light emitting unit from the light emitting unit; forming at least one filling groove 2051 on one side of the second semiconductor layer 203 away from the substrate 100, the filling groove 2051 completely penetrating the second semiconductor layer 203 and the active layer 202, and partially penetrating the first semiconductor layer 201; preparing a first electrode 205 in the filling groove 2051, the first electrode 205 being insulated and blocked from the second semiconductor layer 203 and the active layer 202, and being connected to the first semiconductor layer 201; and preparing a second electrode on one side of the second semiconductor layer away from the active layer.

Figure 20B:
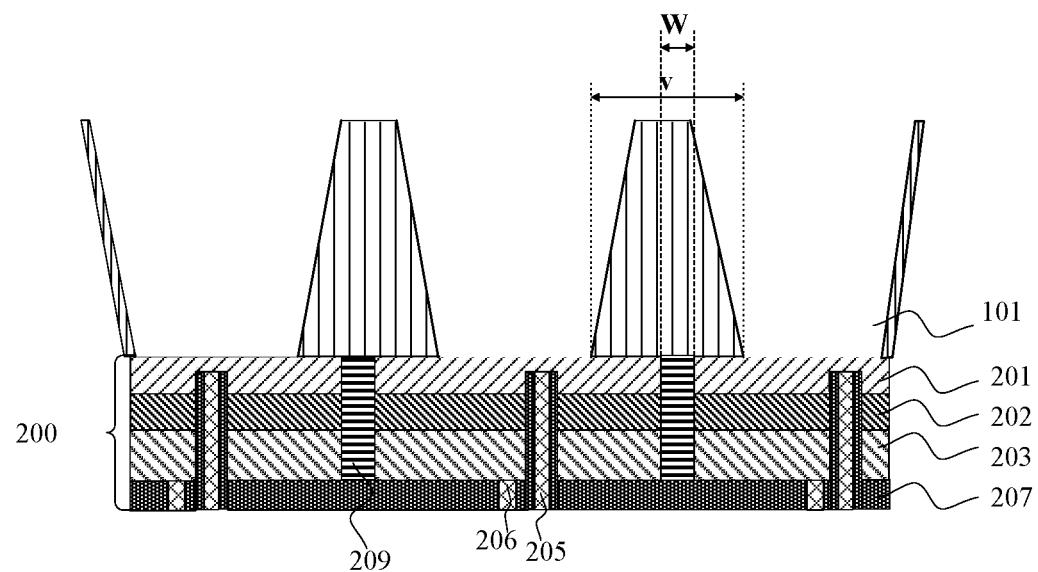
Figure 20C:
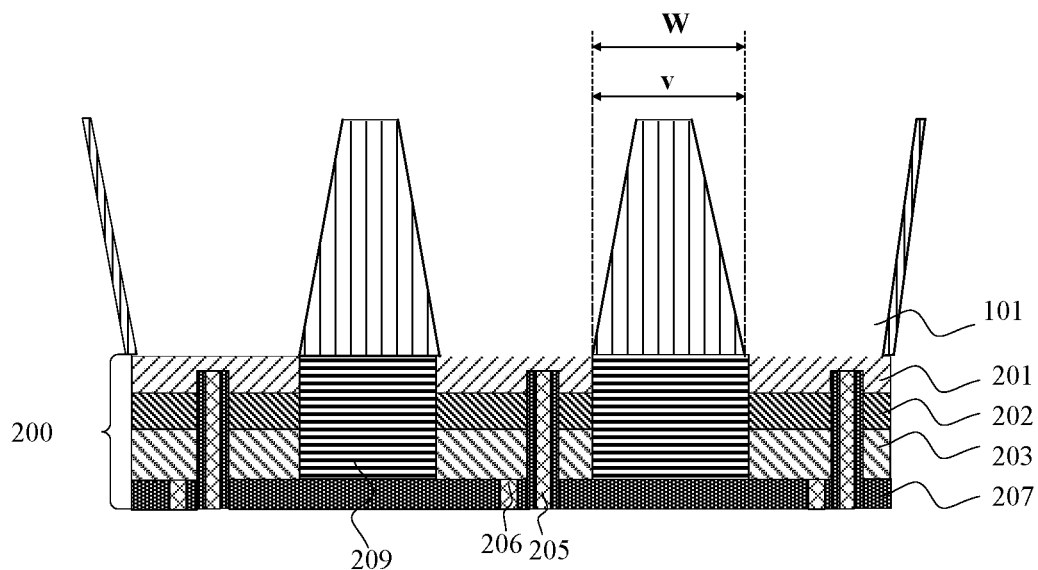
Figure 20D:
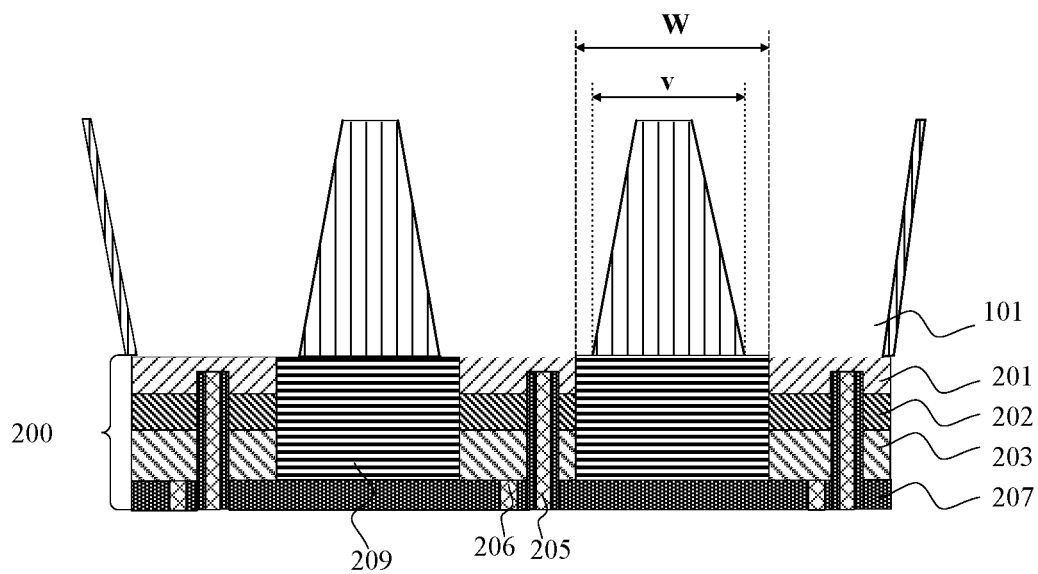

Further, the width W of the ion implanted layer 209 may be smaller than the width V of the remaining substrate, as shown in FIG. 20b. The width W of the ion implanted layer 209 may be equal to the width V of the remaining substrate, as shown in FIG. 20c. The width W of the ion implanted layer 209 may be greater than the width V of the remaining substrate, as shown in FIG. 20d.

Figure 20E:
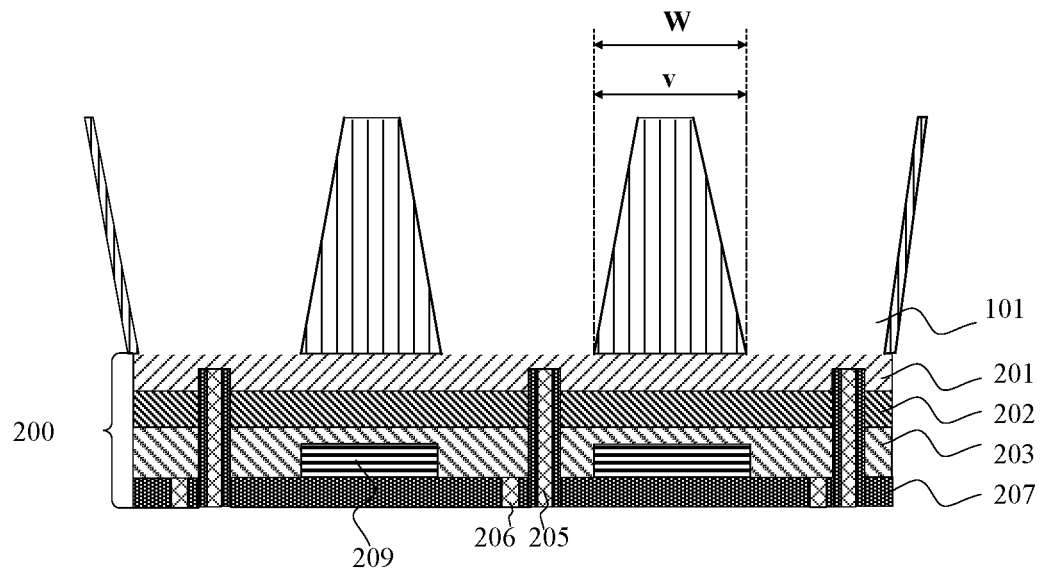
Figure 20F:
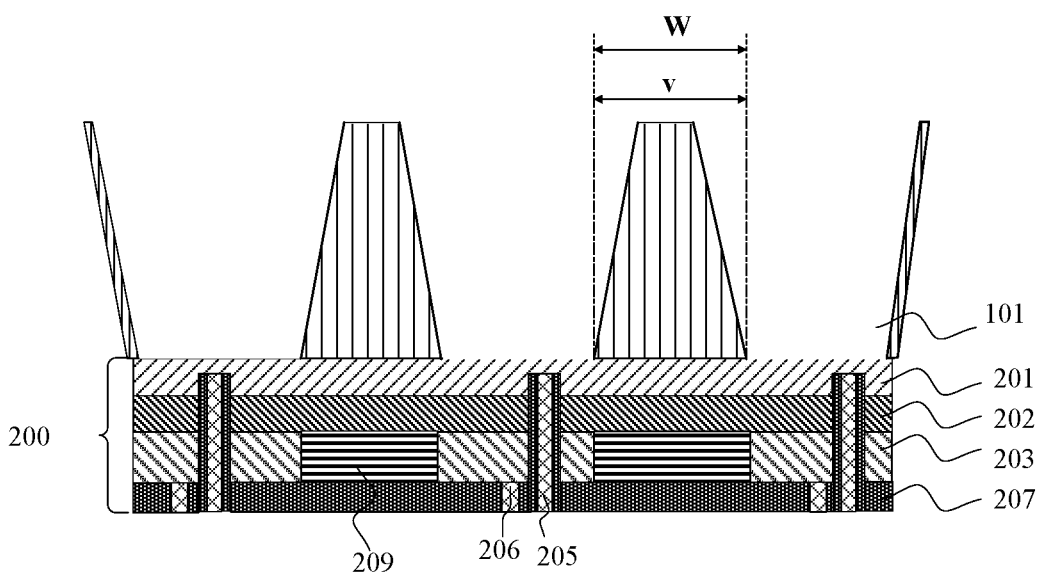
Figure 20G:
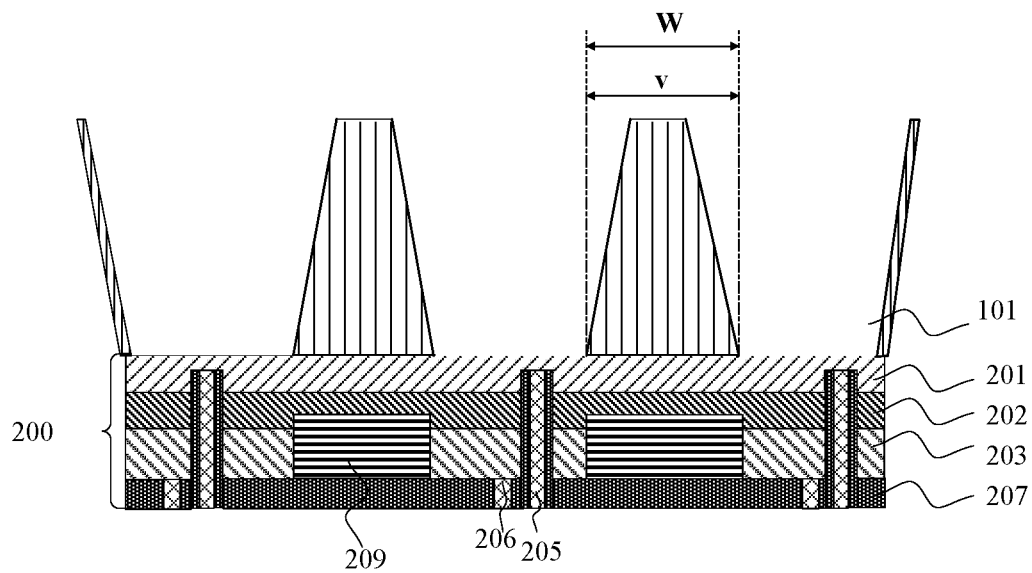
Figure 20H:
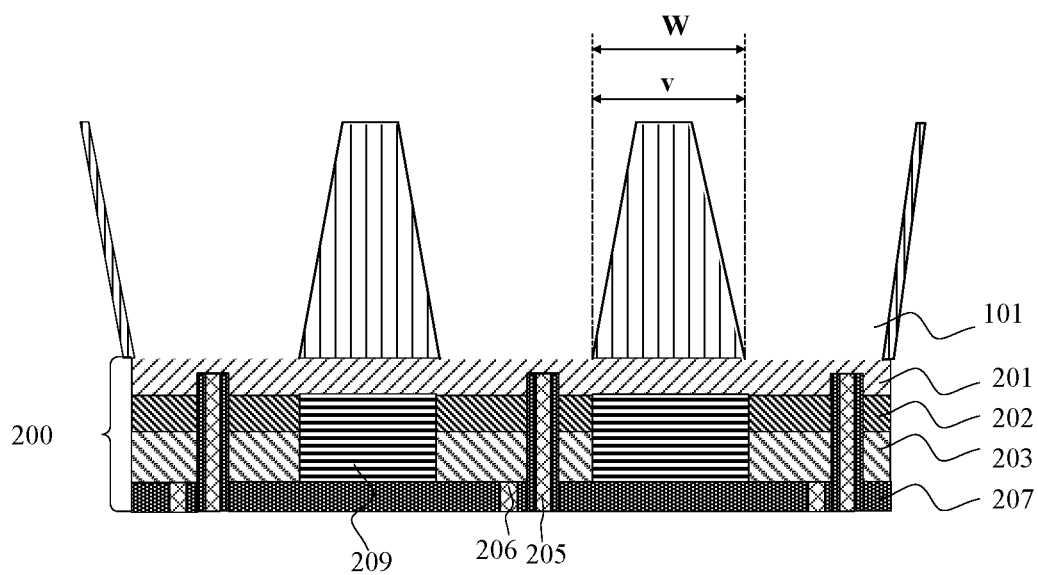
Figure 20I:
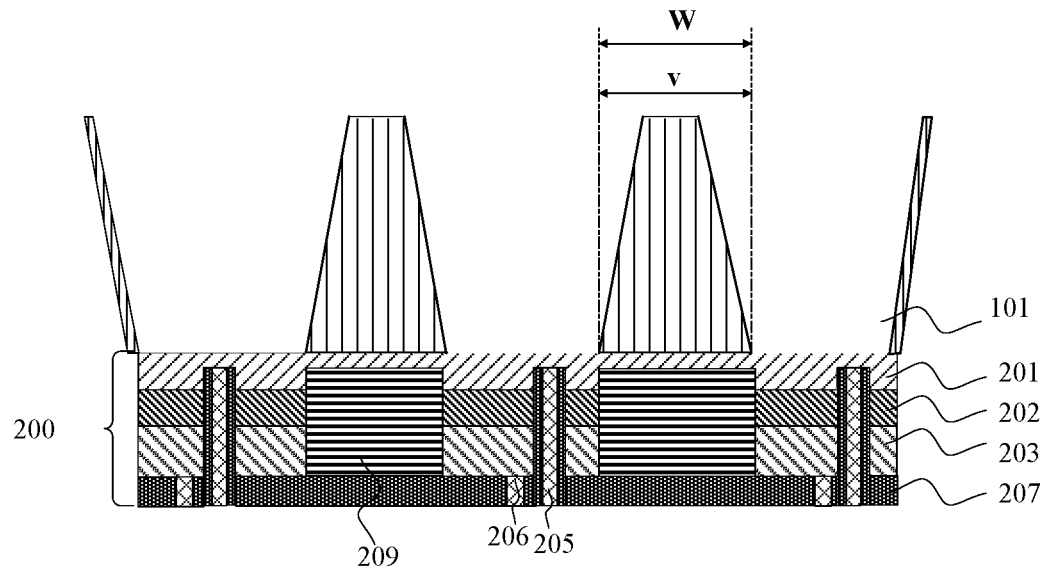

Preferably, the semiconductor structure is as in the embodiments of FIG. 20a to FIG. 20d, and the ion implanted layer 209 completely penetrates the first semiconductor layer 201 from one side of the second semiconductor layer 203 away from the substrate, so that the light emitting unit is isolated from the light emitting unit, which avoids etching and reduces non-radiative recombination at the edges. The technical effect may also be obtained in other embodiments. Taking the semiconductor structure shown in FIG. 20c as an example, the ion implanted layer 209 may partially penetrate the second semiconductor layer 203, as shown in FIG. 20e; the ion implanted layer 209 may completely penetrate the second semiconductor layer 203, as shown in FIG. 20f; the ion implanted layer 209 may partially penetrate the active layer 202, as shown in FIG. 20g; the ion implanted layer 209 may completely penetrate the active layer 202, as shown in FIG. 20h; or the ion implanted layer 209 may partially penetrate the first semiconductor layer 201, as shown in FIG. 20i.

Figure 20J:
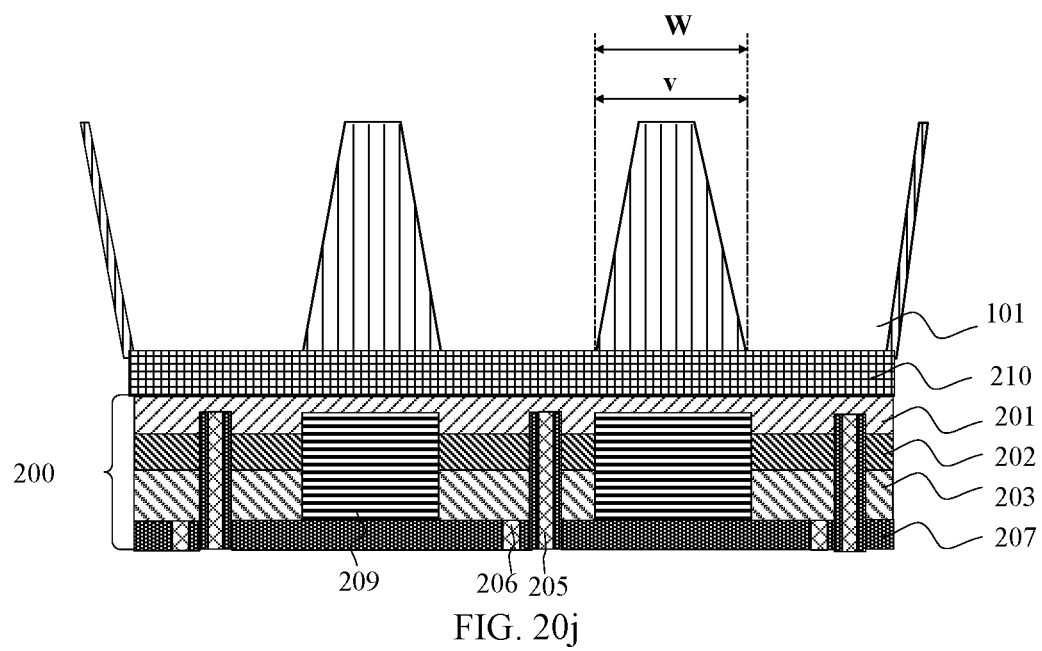

In the embodiment of FIG. 20j, the semiconductor structure includes a buffer layer 210 between the substrate 100 and the first semiconductor layer 201. The ion implanted layer 209 penetrates the second semiconductor layer 203 and the active layer 202, and partially penetrates the first semiconductor layer 201, and the width W of the ion implanted layer 209 is equal to the width V of the remaining substrate. In other embodiments, the ion implanted layer 209 may completely penetrate the first semiconductor layer 201, or at least partially penetrate the second semiconductor layer 203, or at least partially penetrate the active layer 202, and the width W of the ion implanted layer 209 may be less than or greater than the width V of the remaining substrate, which is not repeated here.

When the insulating structure between the light emitting unit and the light emitting unit is a groove 204, as shown in FIG. 21a to FIG. 21f, before forming the first electrode 205 and the second electrode 206, at least one groove 204 may be formed by etching from one side of the second semiconductor layer 203 away from the active layer 202 to isolate the light emitting unit 2001 from the light emitting unit 2001. FIG. 21b to FIG. 21f are schematic diagrams after the semiconductor structure having the groove 204 according to this embodiment is inverted.

Specifically, the step of providing the groove 204 in the light emitting structure includes: sequentially growing the first semiconductor layer 201, the active layer 202, and the second semiconductor layer 203 on one side of the substrate 100; forming the at least one groove 204 on one side of the second semiconductor layer 203 away from the active layer 202, the groove 204 at least partially penetrating the second semiconductor layer 203 to insulate the light emitting unit from the light emitting unit; forming at least one filling groove 2051 on one side of the second semiconductor layer 203 away from the substrate 100, the filling groove 2051 completely penetrating the second semiconductor layer 203 and the active layer 202, and partially penetrating the first semiconductor layer 201; preparing a first electrode 205 in the filling groove 2051, the first electrode 205 being insulated and blocked from the second semiconductor layer 203 and the active layer 202, and being connected to the first semiconductor layer 201; and preparing a second electrode on one side of the second semiconductor layer away from the active layer.

Figure 21A:
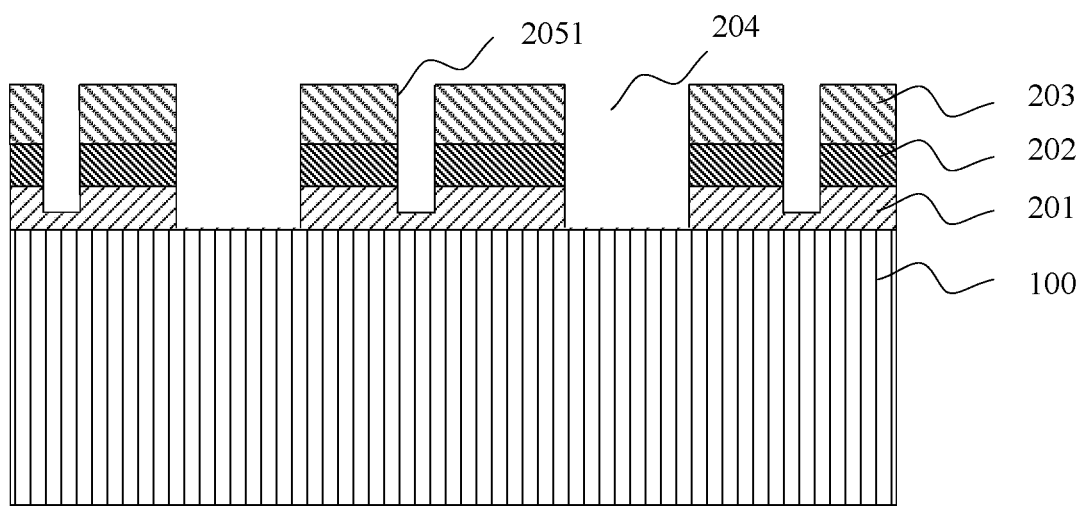
FIG. 21a to FIG. 21f are schematic cross-sectional views illustrating a semiconductor structure in which light emitting units are isolated by a groove according to an embodiment of the present application.
Figure 21B:
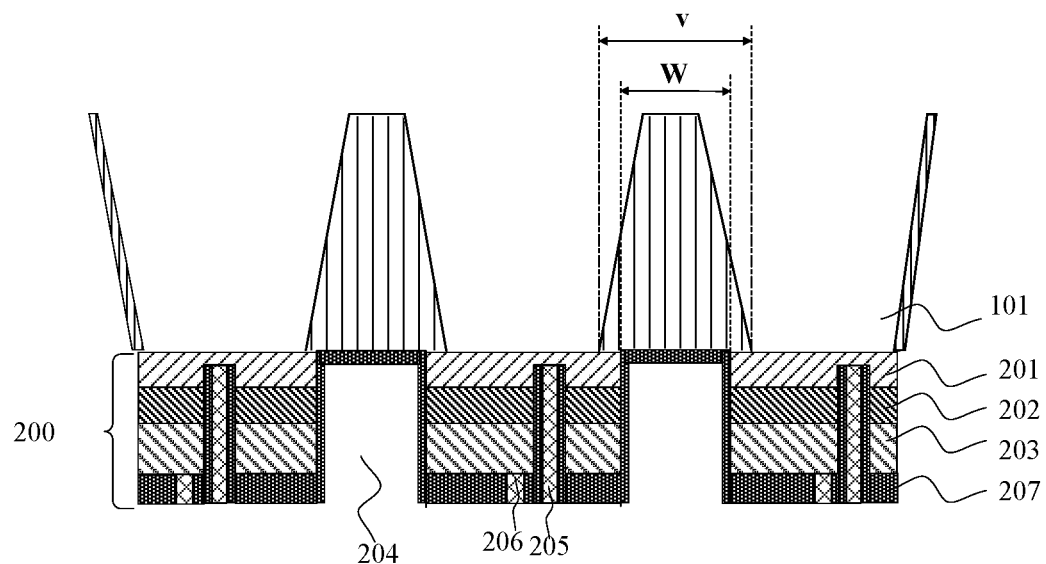
Figure 21C:
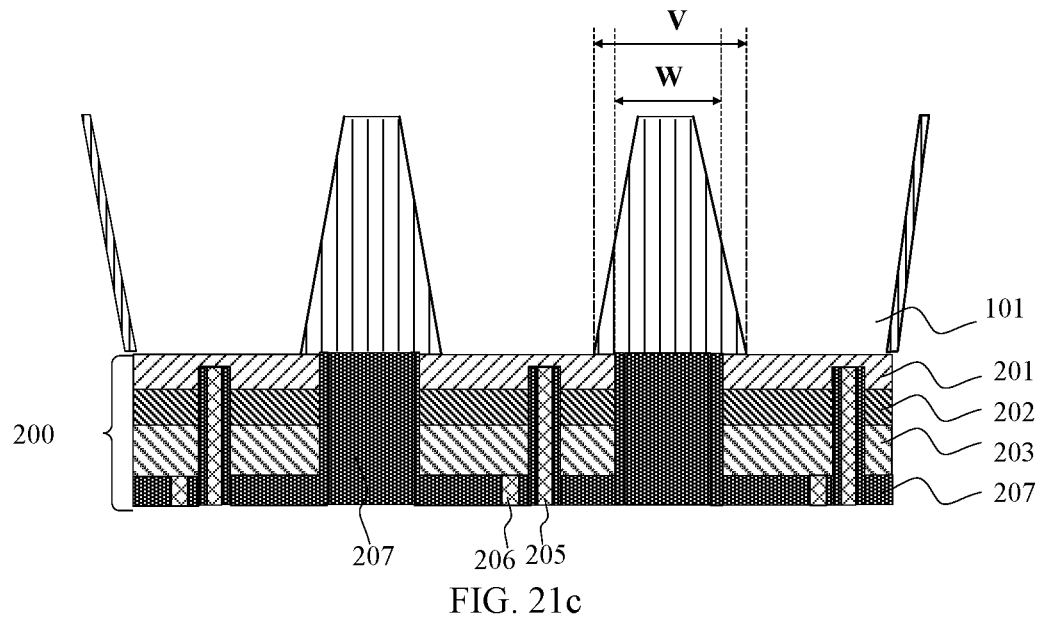

It may be understood that an insulating layer 207 may be disposed on the bottom and the side wall of the groove 204, as shown in FIG. 21b; further, the groove may be filled with the insulating layer 207 fully, as shown in FIG. 21c.

Figure 21D:
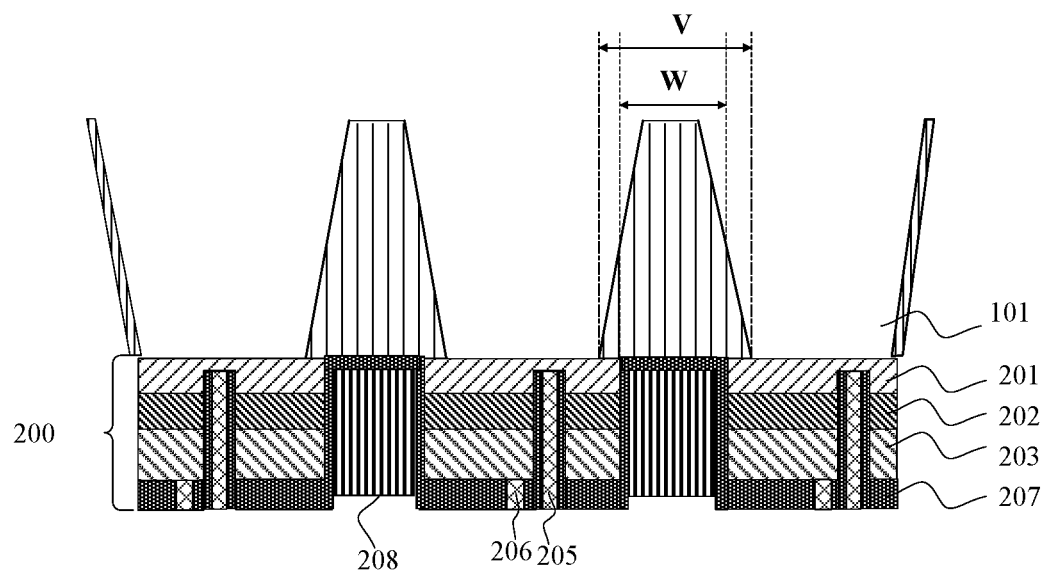

It may be understood that the groove 204 may be filled with other temporary dielectric materials such as photoresist 208, as shown in FIG. 21d.

In this embodiment, the groove 204 completely penetrates the first semiconductor layer 201. In other embodiments, the groove 204 may partially penetrate the second semiconductor layer 203, completely penetrate the second semiconductor layer 203, partially penetrate the active layer 202, completely penetrate the active layer 202, and partially penetrate the first semiconductor layer 201, which is not specifically limited herein.

Figure 21E:
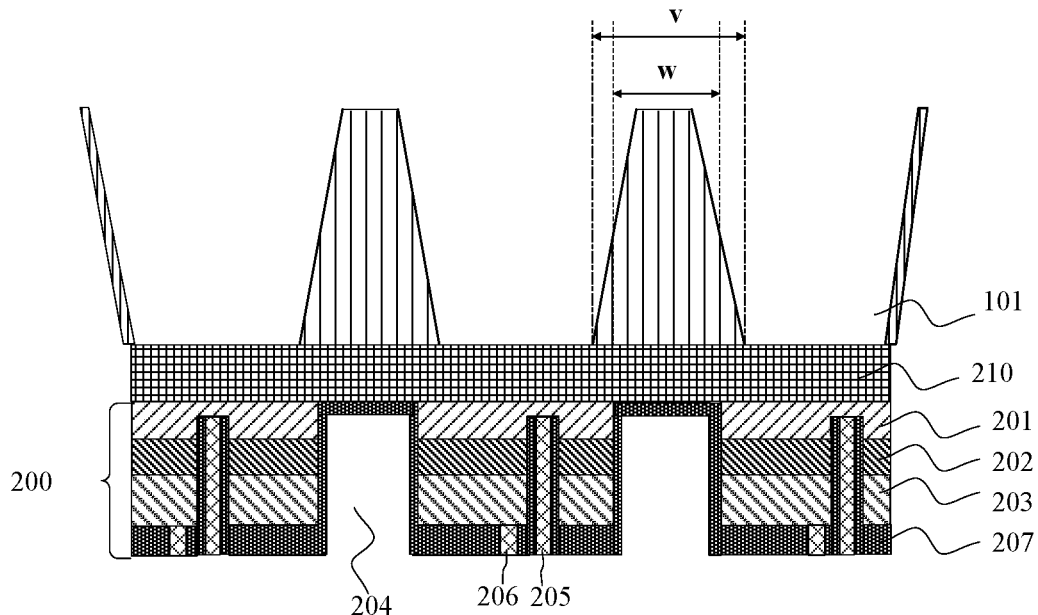

In the embodiment of FIG. 21e, the semiconductor structure includes a buffer layer 210 between the substrate 100 and the first semiconductor layer 201. The groove 204 completely penetrates the first semiconductor layer 201, and the width W of the groove 204 is smaller than the width V of the remaining substrate. In other embodiments, the groove 204 may partially penetrate the first semiconductor layer 201, or at least partially penetrate the second semiconductor layer 203, or at least partially penetrate the active layer 202, and the width W of the groove 204 may be greater than or equal to the width V of the remaining substrate, which is not repeated here.

Figure 21F:
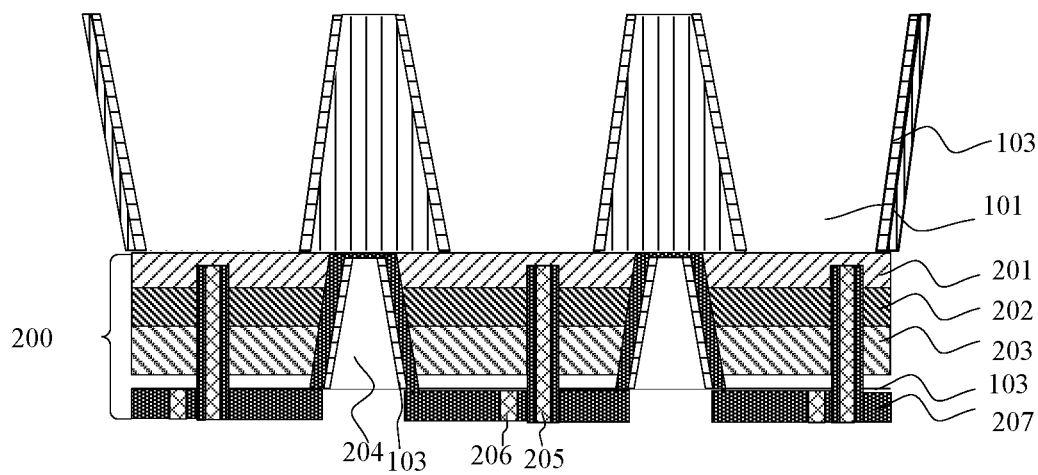

Preferably, in order to improve the light emitting efficiency of the semiconductor device, a reflective layer 103 may be plated on the side wall of the groove 204, the side wall of the light guide groove 101, and one side of the second semiconductor layer away from the active layer 202 in the light emitting structure, as shown in FIG. 21f.

Figure 22:
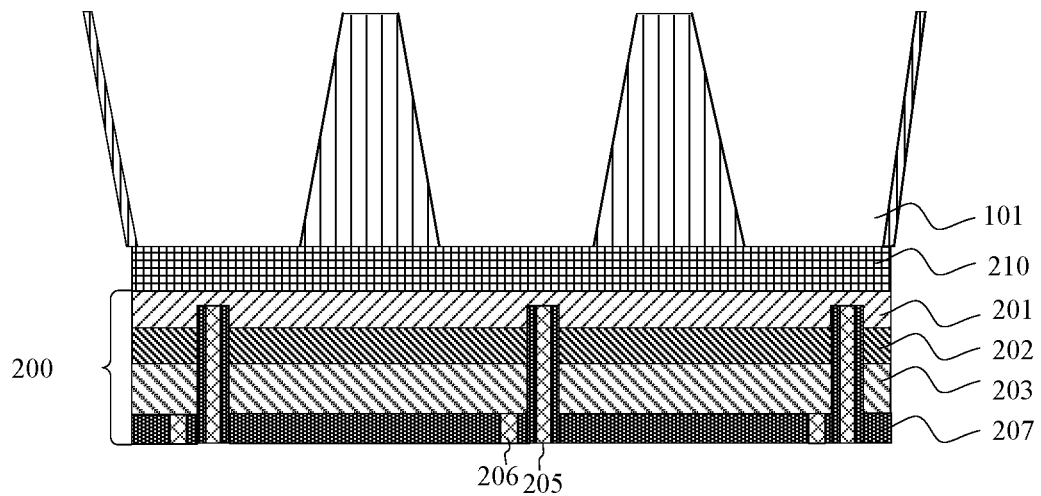
FIG. 22 is a schematic cross-sectional view illustrating a semiconductor structure in which a light emitting structure has a buffer layer according to an embodiment of the present application.

FIG. 22 is a schematic cross-sectional view of the semiconductor structure corresponding to FIG. 2b. It may be understood that, in this embodiment, a groove and an ion implanted layer may be provided on the light emitting structure to isolate the light emitting units. The groove and the ion implanted layer at least partially penetrate the second semiconductor layer 203, i.e., the groove and the ion implanted layer may partially penetrate the second semiconductor layer 203, completely penetrate the second semiconductor layer 203, partially penetrate the active layer 202, completely penetrate the active layer 202, partially penetrate the first semiconductor layer 201, completely penetrate the first semiconductor layer 201, partially penetrate the buffer layer 210, and completely penetrate the buffer layer 210, which is not specifically limited herein.

It may be understood that the specific number of the light emitting units is not limited in the embodiments of the present application. The semiconductor structure manufactured by the methods of the embodiments of the present application adopts a thin film flip-chip process, without stripping the substrate. The light guide groove is formed by etching the substrate to make each light emitting unit emit light uniformly, with good directivity and high light extraction rate, which avoids the crosstalk of the emitted light between the light emitting unit and the light emitting unit. The light guide groove corresponding to the at least one light emitting unit is formed on the substrate to prevent defective core particles. A wavelength conversion dielectric is directly coated on the remaining substrate to avoid a coffee ring effect and achieve full-color display with high resolution and cost saving. In addition, the semiconductor structure solves the problem of a common cathode, so that the current distribution between different pixels is uniform.

FIG. 9a is a schematic structural diagram illustrating a semiconductor structure according to an embodiment of the present application. The semiconductor structure includes:

a substrate 100 on which at least one light guide groove 101 is provided, the light guide groove 101 penetrating the substrate 100; and a light emitting structure 200 disposed on one side of the substrate.

The light emitting structure 200 includes: a first semiconductor layer 201, an active layer 20, and a second semiconductor layer 203, at least one set of a first electrode 205 and a second electrode 206.

The first semiconductor layer 201, the active layer 202, and the second semiconductor layer 203 are sequentially disposed on the substrate 100.

The first electrode 205 is connected to the first semiconductor layer 201 and insulated and blocked from the second semiconductor layer 203 and active layer 202.

The second electrode 206 is connected to the second semiconductor layer 203, and insulated and blocked from the first electrode 205.

The light guide groove 101 at least corresponds to one set of the first electrode 205 and the second electrode 206.

Specifically, as shown in FIG. 9a, the light emitting structure 200 is divided into three light emitting units 2001 by dotted lines. Each light emitting unit 2001 includes the first semiconductor layer 201, the active layer 202, and the second semiconductor layer 203, and includes only one set of the first electrode and the second electrode. The light guide groove 101 may correspond to one light emitting unit 2001, as shown in FIG. 9a. The light guide groove 101 may correspond to a plurality of light emitting units 2001, as shown in FIG. 10. When the plurality of light emitting units 2001 correspond to the light guide groove 101, other light emitting units in the light guide groove 101 still working when a certain light emitting unit is disconnected, thus avoiding the "bad point" problem commonly seen in the display field. The number of the light emitting units 2001 corresponding to the light guide groove 101 is not particularly limited, as long as at least one light emitting unit 2001 corresponds to the light guide groove 101, and the number of the light emitting units 2001 corresponding to the light guide groove 101 may be set according to the actual application requirements of specific devices.

The semiconductor structure further includes a quantum dot layer 102 deposited in the light guide groove 101, as shown in FIG. 11. Specifically, the substrate 100 is made of silicon, silicon carbide, sapphire, or the like, and of course, may also be made of other substrate materials, which is not limited herein. A silicon substrate is preferred. The silicon substrate is easy to etch. In addition, an epitaxial structure prepared based on the silicon substrate may obtain light with better uniformity. The substrate is etched, and the remaining substrate after the etching may be used as a mask, and quantum dots may be directly coated on the mask to form the quantum dot layer 102. The remaining substrate may modulate a light beam, which helps to concentrate the light, prevents the crosstalk of light between pixels and saves costs. The quantum dot layer 102 realizes the full-color display of the semiconductor structure.

Further, the semiconductor structure further includes a reflective layer 103 on a side wall of the light guide groove 101, as shown in FIG. 12. The material of the reflective layer 103 may be one of silver, aluminum, nickel, and other metals having a reflection effect on light, or a metal alloy or metal combination layer composed of a plurality of metals, or an alloy superlattice structure.

In this embodiment, the semiconductor structure includes at least one filling groove 2051 penetrating from the second semiconductor layer 203 to the first semiconductor layer 201, and the first electrode 205 is formed by filling an electrode material in the filling groove 2051. An insulating material 207 is provided between a side wall of the filling groove 2051 and the first electrode 205 to achieve the insulation and blocking between the first electrode 205 and the second semiconductor layer 203, and the active layer 202. The material of the second electrode 206 is the same as the material of the first electrode 205.

In this embodiment, the first semiconductor layer 201 may have N-type conductivity, and the second semiconductor layer 203 may have P-type conductivity. Optionally, the second semiconductor layer 203 may have N-type conductivity, and the first semiconductor layer 201 may have P-type conductivity.

Further, the semiconductor structure further includes a buffer layer 210 provided between the substrate 100 and the first semiconductor layer 201, as shown in FIG. 22.

Specifically, as shown in FIG. 21*a* to FIG. 21*f*, the semiconductor structure provided in this embodiment further includes a groove 204 at least partially penetrating the second semiconductor layer 203 and provided on one side of the second semiconductor layer 203 away from the active layer 202. The insulating material 207 is at least deposited on the bottom and the side wall of the groove 204 to divide the light emitting structure into a plurality of light emitting units 2001. Specifically, each light emitting unit 2001 includes a first semiconductor layer 201, an active layer 202, a second semiconductor layer 203, one set of the first electrode 205 and the second electrode 206. One end of the first electrode 205 in each light emitting unit 2001 is connected to the first semiconductor layer 201.

Further, as shown in FIG. 20*a* to FIG. 20*j*, the groove 204 for depositing the insulating material may be replaced by an ion implanted layer 209 to achieve the same technical effect. The implanted ions include H, F, etc.

Figure 23:
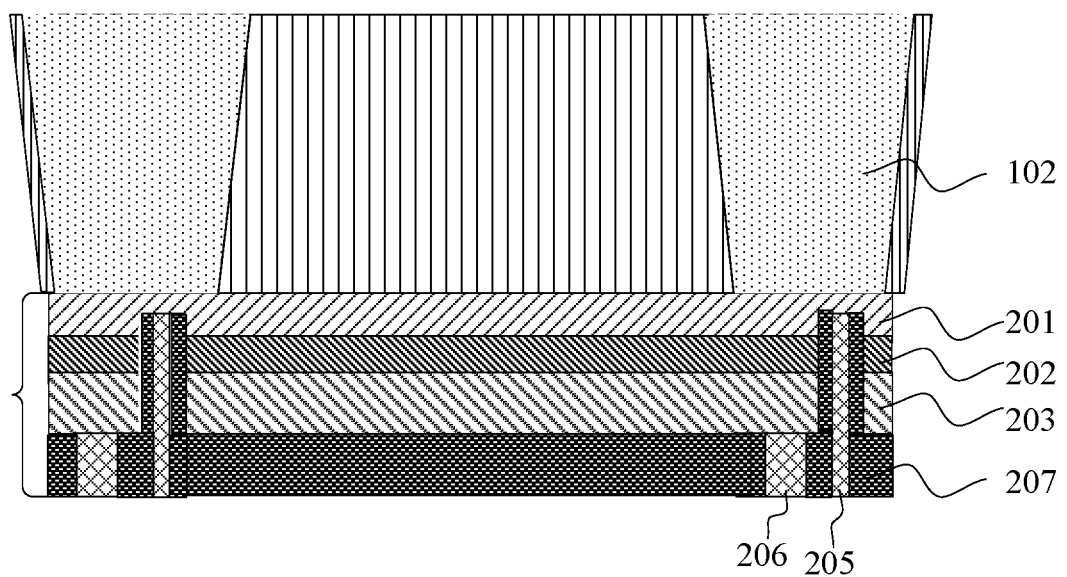
FIG. 23 is a schematic cross-sectional view illustrating a semiconductor structure in which the distance between light emitting units is relatively long according to an embodiment of the present application.

It may be understood that the width of the groove 204 or the ion implanted layer 209 is adjusted according to the actual application pixel requirement. The higher the pixel requirement, the smaller the width of the groove 204 or the ion implanted layer 209; and the lower the pixel requirement, the larger the width of the groove 204 or the ion implanted layer 209. Further, when the width of the groove 204 or the ion implanted layer 209 is large, as shown in FIG. 23, components such as sensors, switches, etc. may be integrated on the etched substrate, so as to make the semiconductor structure functional and applied in various electronic information fields.

According to the above device structures, a structure in which the first semiconductor layer 201 is shared between the pixel units is provided, and the first semiconductor layer 201 may have N-type conductivity, and the first semiconductor layer 201 may have P-type conductivity. One set of a first electrode 205 and a second electrode 206 is provided in each light emitting unit, so that the difference in equivalent resistance between the light emitting units is reduced, and the problem of uneven current distribution to different pixel units caused by an increase in the equivalent resistance of a conductive path is solved.

The semiconductor structure in the embodiments of the present application requires the driving of an external driving circuit 300 to emit light. As shown in FIG. 12, specifically, the first electrode 205 and the second electrode 206 may be connected to an electrode bonding pad 302 in the external driving circuit 300 through a conductive structure 301. In addition, the driving circuit 300 may be made into an active driving mode or a passive driving mode. The active driving mode has a fast response speed and is not limited by the number of scanning electrodes, and each pixel unit may be individually addressed and independently controlled, which is suitable for most applications. However, the passive driving mode uses progressive scanning to display, and the production cost and technical threshold are low, but it cannot achieve high resolution display well.

In summary, the semiconductor structure in the embodiments of the present application adopts a thin film flip-chip process, without stripping the substrate. The light guide groove is formed by etching the substrate to make each light emitting unit emit light uniformly, with good directivity and high light extraction rate, which avoids the crosstalk of the emitted light between the light emitting unit and the light emitting unit. The light guide groove corresponding to the at least one light emitting unit is formed on the substrate to prevent defective core particles. A wavelength conversion dielectric is directly coated on the remaining substrate to avoid a coffee ring effect and achieve full-color display with high resolution and cost saving. In addition, the semiconductor structure solves the problem of a common cathode, so that the current distribution between different pixels is uniform.

It should also be noted that, in the description of the present application, unless otherwise stated and defined, the terms "setup", "mounted", "coupled", and "connected" should be understood in a broad sense. For example, the meaning of the terms may be a fixed connection, a detachable connection, or an integral connection; the meaning of the terms may be a mechanical connection or an electrical connection; and the meaning of the terms may be a direct connection, or an indirect connected through an intermediate medium, or the meaning of the terms may be an internal communication of two components. For those of ordinary skill in the art, the specific meanings of the above terms in the present application may be understood depending on specific circumstances.

It should be noted that similar reference numerals and letters indicate similar items in the following accompanying drawings, so once an item is defined in one accompanying drawing, it need not be further defined and explained in the subsequent accompanying drawings.

In the description of the present application, it should be noted that the orientation or position relations indicated by the terms "center", "above", "below", "left", "right", "vertical", "horizontal", "inside", "outside", etc. are based on the orientation or position relations shown in the accompanying drawings, or are the orientation or position relations in which the product of the present application is usually placed in use, merely for facilitating the description of the present application and simplifying the description, but not intended to indicate or imply that the referred device or element must be in a particular orientation, or constructed and operated in a specific orientation, and therefore they should not be construed as a limitation on the present application. In addition, the terms "first", "second", "third", etc. are only used to distinguish descriptions and should not be interpreted as indicating or implying relative importance.

The above descriptions are merely preferred embodiments of the present application and are not intended to limit the present application. For those skilled in the art, the present application may have various modifications and changes. Any modification, equivalent replacement, and improvement made within the spirit and principle of the present application shall be included in the protection scope of the present application.

What is claimed is:

1. A semiconductor structure, comprising: a substrate comprising a first side and a second side opposite to the first side, at least one light guide groove being provided on the first side, the light guide groove penetrating the substrate; and a light emitting structure disposed on the second side of the substrate and outside the substrate, the light emitting structure comprising two or more light emitting units, wherein the light guide groove corresponds to the two or more light emitting units, wherein the light emitting structure comprises: a first semiconductor layer, an active layer, a second semiconductor layer, at least one set of a first electrode and a second electrode; the first semiconductor layer, the active layer, and the second semiconductor layer are sequentially disposed on the substrate; the first electrode is connected to the first semiconductor layer, and is insulated and blocked from the second semiconductor layer and the active layer; and the second electrode is connected to the second semiconductor layer and is insulated and blocked from the first electrode, wherein the first semiconductor layer is shared between the two or more light emitting units.

2. The semiconductor structure according to claim 1, further comprising an insulating structure provided between the two adjacent light emitting units.

3. The semiconductor structure according to claim 2, wherein the insulating structure is an ion implanted layer.

4. The semiconductor structure according to claim 2, wherein the insulating structure is a groove.

5. The semiconductor structure according to claim 4, wherein a bottom and a side wall of the groove are provided with an insulating material.

6. The semiconductor structure according to claim 1, wherein a wavelength conversion dielectric layer is provided in the light guide groove, and the wavelength conversion dielectric layer is made of quantum dots or phosphors.

7. The semiconductor structure according to claim 1, wherein a reflective layer is provided on an inner side wall of the light guide groove.

8. The semiconductor structure according to claim 1, wherein a shape of the light guide groove viewed from a plan view perpendicular to a surface of the substrate opposite to the light emitting structure is semicircle.

9. The semiconductor structure according to claim 1, wherein the light emitting structure further comprises: at least one filling groove penetrating from one side of the second semiconductor layer away from the substrate to the first semiconductor layer, the filling groove partially penetrating the first semiconductor layer, and the first electrode being located in the filling groove; and an insulating material provided between a side wall of the filling groove and the first electrode.

10. A method for manufacturing a semiconductor structure, comprising: providing a substrate, the substrate comprising a first side and a second side opposite to the first side; forming a light emitting structure on the second side of the substrate and outside the substrate, the light emitting structure comprising two or more light emitting units; and etching the substrate from the first side to form at least one light guide groove on the substrate, the light guide groove penetrating the substrate, wherein the light guide groove corresponds to the two or more light emitting units, wherein a method for manufacturing the light emitting structure comprises: sequentially growing a first semiconductor layer, an active layer, and a second semiconductor layer on the second side of the substrate; forming at least one filling groove on one side of the second semiconductor layer away from the substrate, the filling groove completely penetrating the second semiconductor layer, the active layer, and partially penetrating the first semiconductor layer; preparing a first electrode in the filling groove, the first electrode being insulated and blocked from the second semiconductor layer and the active layer, and being connected to the first semiconductor layer; and preparing a second electrode on one side of the second semiconductor layer away from the active layer.

11. The method for manufacturing a semiconductor structure according to claim 10, further comprising:
forming a wavelength conversion dielectric layer in the light guide groove, wherein the wavelength conversion dielectric layer is made of quantum dots or phosphors.

12. The method for manufacturing a semiconductor structure according to claim 10, further comprising:
forming a reflective layer on a side wall of the light guide groove in advance.

13. The method for manufacturing a semiconductor structure according to claim 10, wherein an insulating structure is provided between the two adjacent light emitting units.

14. The method for manufacturing a semiconductor structure according to claim 13, wherein the insulating structure is an ion implanted layer.

15. The method for manufacturing a semiconductor structure according to claim 13, wherein the insulating structure is a groove.

16. The method for manufacturing a semiconductor structure according to claim 15, wherein a bottom and a side wall of the groove are provided with an insulating material.

17. The semiconductor structure according to claim 3, wherein a width of a surface of the ion implanted layer which is adjacent to the substrate is greater than a width of a remaining substrate close to the light emitting structure.

* * * * *